United States Patent
Lee et al.

(10) Patent No.: US 9,997,537 B2
(45) Date of Patent: Jun. 12, 2018

(54) SEMICONDUCTOR DEVICES INCLUDING GATE INSULATION LAYERS ON CHANNEL MATERIALS AND METHODS OF FORMING THE SAME

(71) Applicants: Jung-Hwan Lee, Seoul (KR); Jee-Yong Kim, Hwaseong-si (KR); Dae-Seok Byeon, Seongnam-si (KR)

(72) Inventors: Jung-Hwan Lee, Seoul (KR); Jee-Yong Kim, Hwaseong-si (KR); Dae-Seok Byeon, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/375,387

(22) Filed: Dec. 12, 2016

(65) Prior Publication Data

US 2017/0092657 A1  Mar. 30, 2017

Related U.S. Application Data

(63) Continuation of application No. 14/995,845, filed on Jan. 14, 2016, now Pat. No. 9,553,105.

(60) Provisional application No. 62/130,848, filed on Mar. 10, 2015.

(30) Foreign Application Priority Data

Mar. 10, 2015 (KR) .......................... 10-2015-0032988
May 13, 2015 (KR) .......................... 10-2015-0066841

(51) Int. Cl.
*H01L 27/11582* (2017.01)
*H01L 29/66* (2006.01)
*H01L 29/423* (2006.01)
*H01L 21/28* (2006.01)

(52) U.S. Cl.
CPC .. *H01L 27/11582* (2013.01); *H01L 21/28282* (2013.01); *H01L 29/42352* (2013.01); *H01L 29/66833* (2013.01)

(58) Field of Classification Search
CPC ......... H01L 27/11582; H01L 21/28282; H01L 29/66833; H01L 29/42352
See application file for complete search history.

(56) References Cited

U.S. PATENT DOCUMENTS

| | | | |
|---|---|---|---|
| 8,013,383 B2 | 9/2011 | Kidoh et al. |
| 8,030,700 B2 | 10/2011 | Sakamoto |
| 8,236,650 B2 | 8/2012 | Son et al. |
| 8,482,049 B2 | 7/2013 | Son et al. |
| 8,772,857 B2 | 7/2014 | Choe et al. |
| 8,822,322 B2 | 9/2014 | Lee et al. |
| 8,877,626 B2 | 11/2014 | Lee et al. |
| 8,987,805 B2 | 3/2015 | Nam et al. |

(Continued)

*Primary Examiner* — Benjamin Sandvik
*Assistant Examiner* — Farid Khan
(74) *Attorney, Agent, or Firm* — Myers Bigel, P.A.

(57) ABSTRACT

Semiconductor devices are provided. A semiconductor device includes a stack of alternating insulation layers and gate electrodes. The semiconductor device includes a channel material in a channel recess in the stack. The semiconductor device includes a charge storage structure on the channel material, in the channel recess. Moreover, the semiconductor device includes a gate insulation layer on the channel material. The gate insulation layer undercuts a portion of the channel material. Related methods of forming semiconductor devices are also provided.

20 Claims, 22 Drawing Sheets

(56) References Cited

U.S. PATENT DOCUMENTS

| | | |
|---|---|---|
| 2012/0003828 A1 | 1/2012 | Chang et al. |
| 2012/0104484 A1 | 5/2012 | Lee et al. |
| 2013/0034945 A1 | 2/2013 | Park |
| 2013/0134492 A1* | 5/2013 | Yang ................ H01L 27/11582 257/314 |
| 2013/0187220 A1* | 7/2013 | Surthi ................ H01L 21/764 257/329 |
| 2014/0035033 A1 | 2/2014 | Lim et al. |
| 2014/0054675 A1 | 2/2014 | Lee |
| 2014/0054676 A1* | 2/2014 | Nam ................ H01L 29/7926 257/324 |
| 2014/0070300 A1* | 3/2014 | Jang ................ H01L 27/11565 257/324 |
| 2014/0070302 A1* | 3/2014 | Yoo ................ H01L 27/1157 257/324 |
| 2014/0264548 A1 | 9/2014 | Lee et al. |
| 2015/0060979 A1 | 3/2015 | Lee et al. |
| 2015/0179660 A1* | 6/2015 | Yada ................ H01L 21/02164 257/321 |
| 2015/0279857 A1* | 10/2015 | Kim ................ H01L 27/11582 438/269 |
| 2015/0318301 A1* | 11/2015 | Lee ................ H01L 29/7926 257/324 |
| 2015/0357345 A1* | 12/2015 | Lee ................ H01L 27/11582 257/324 |
| 2016/0043100 A1 | 2/2016 | Lee et al. |
| 2016/0064227 A1* | 3/2016 | Go ................ H01L 29/495 438/585 |
| 2016/0104719 A1 | 4/2016 | Jung et al. |
| 2016/0111439 A1 | 4/2016 | Tsutsumi et al. |
| 2016/0118391 A1 | 4/2016 | Zhao et al. |
| 2016/0133643 A1 | 5/2016 | Choi et al. |

* cited by examiner

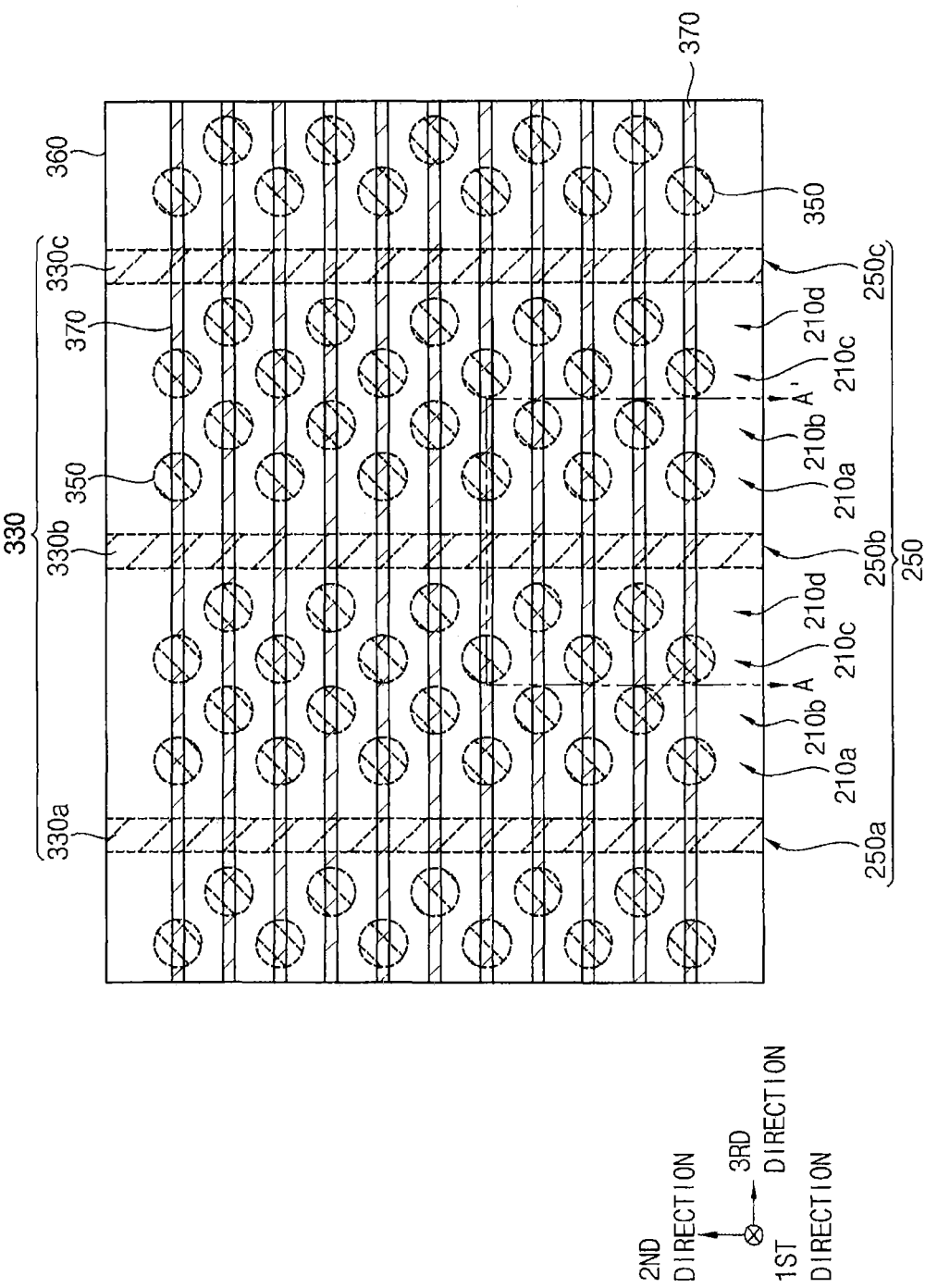

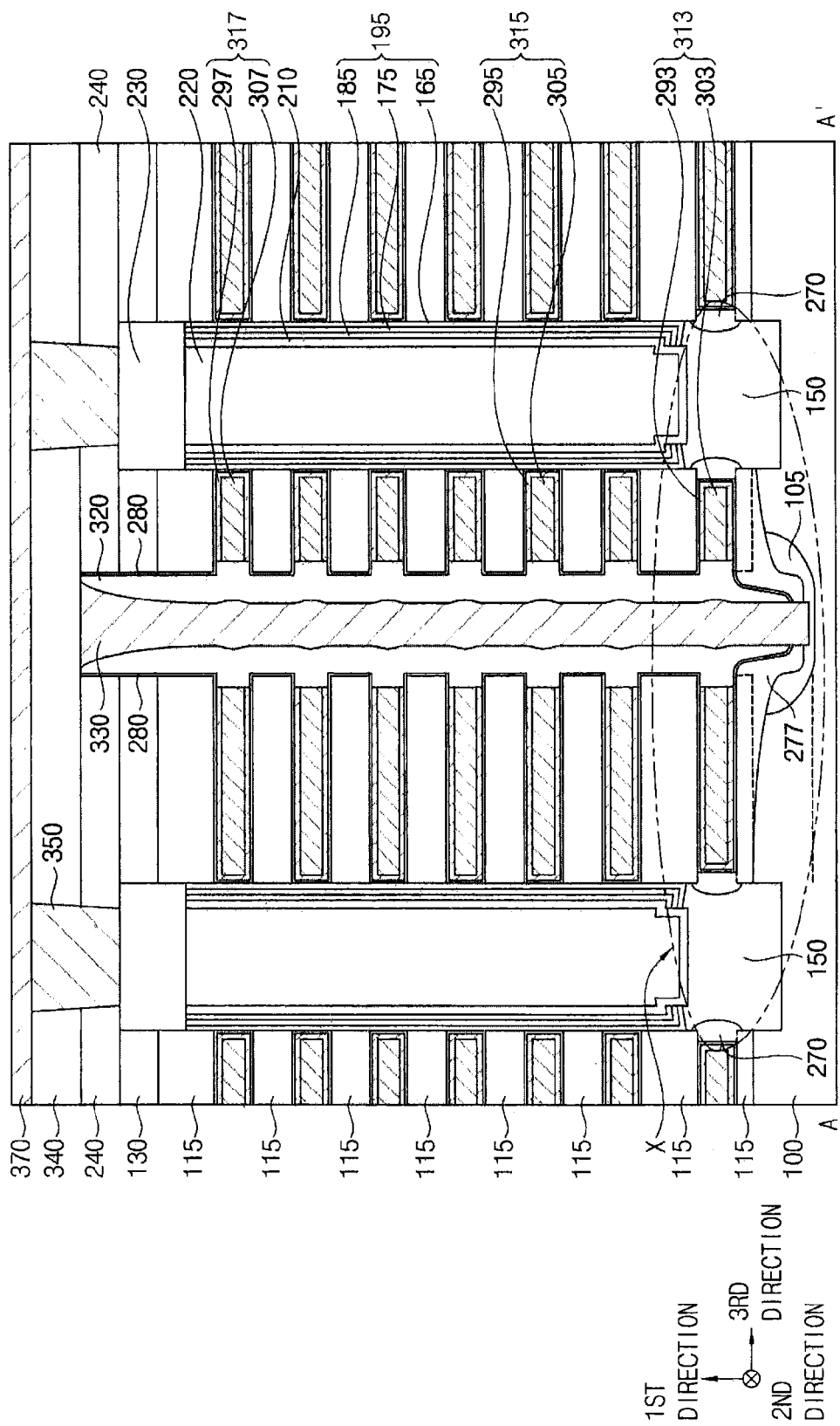

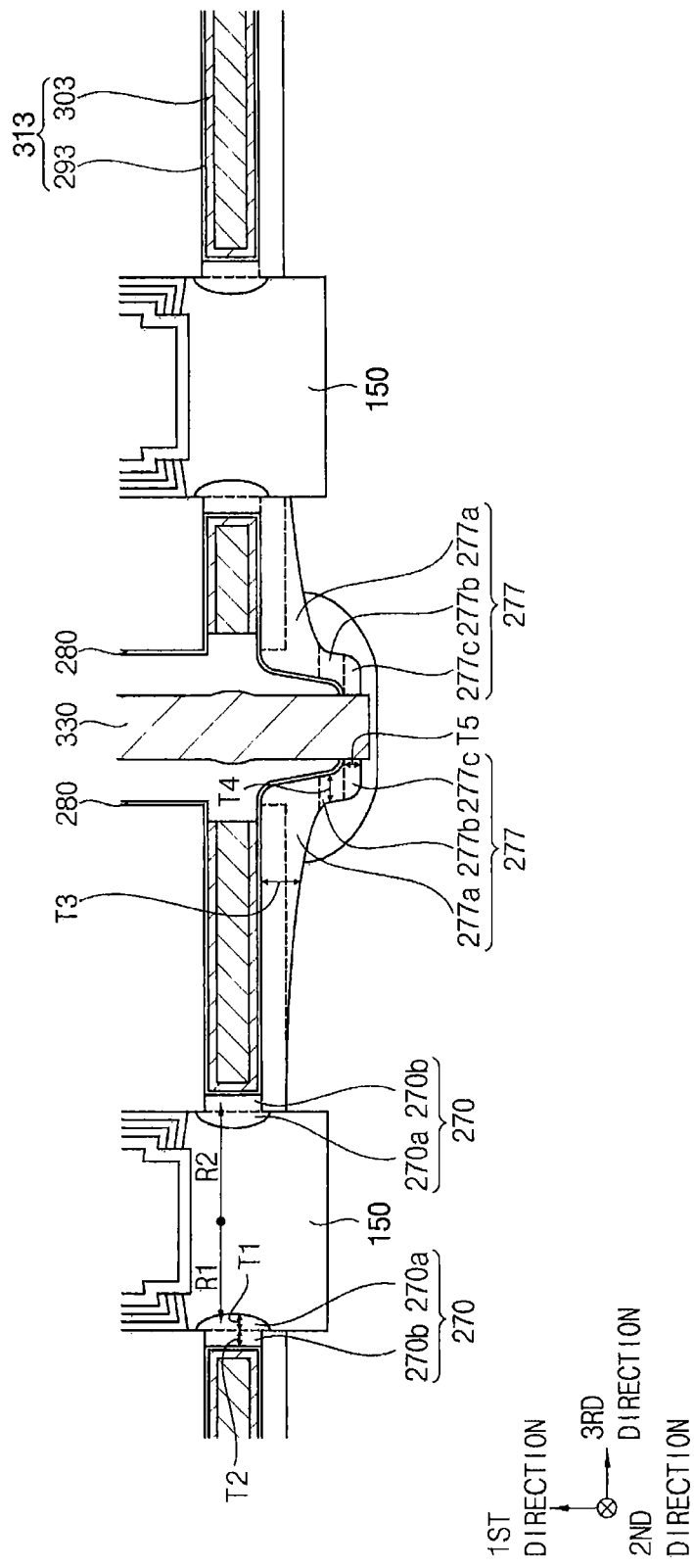

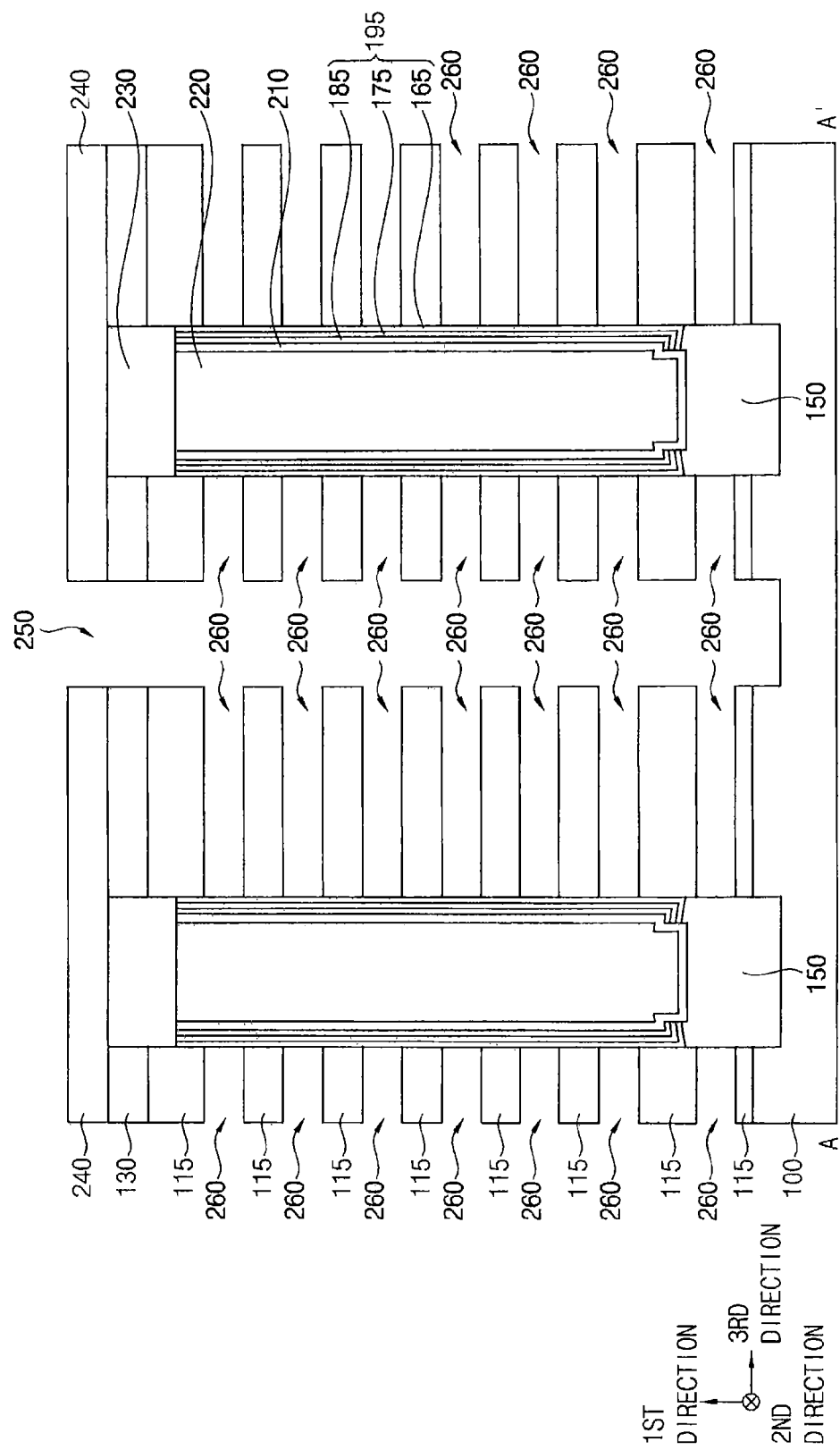

SEMICONDUCTOR DEVICES INCLUDING GATE INSULATION LAYERS ON CHANNEL MATERIALS AND METHODS OF FORMING THE SAME

CROSS-REFERENCE TO RELATED APPLICATIONS

This U.S. non-provisional patent application is a continuation of U.S. application Ser. No. 14/995,845, filed on Jan. 14, 2016, which claims priority to U.S. Provisional Application No. 62/130,848, filed on Mar. 10, 2015, and also claims priority under 35 U.S.C. § 119 to Korean Patent Application Nos. 10-2015-0032988 and 10-2015-0066841, filed on Mar. 10, 2015 and May 13, 2015, respectively, in the Korean Intellectual Property Office (KIPO), the contents of which are hereby incorporated by reference herein in their entireties.

BACKGROUND

The present disclosure relates to semiconductor devices. When a non-volatile semiconductor memory device is manufactured, a channel hole may be formed through insulation layers and sacrificial layers that are alternately and repeatedly stacked on a substrate. A semiconductor pattern may be formed in a lower portion of the channel hole. An Oxide-Nitride-Oxide (ONO) layer and a channel may be formed in an upper portion of the semiconductor pattern. An opening may be formed through the insulation layers and the sacrificial layers, and the sacrificial layers exposed by the opening may be removed to form gaps exposing sidewalls of the ONO layer and the semiconductor pattern. Gate electrodes may be formed to fill the gaps.

Controlling breakdown voltages of word lines and String Select/Selection Lines (SSLs), which may be formed at relatively high (e.g., upper) levels among the gate electrodes, may be possible because the ONO layer may be formed between the word lines and the channel, and between the SSLs and the channel. Controlling breakdown voltages of Ground Select/Selection Lines (GSLs), however, which may be formed at relatively low (e.g., lower) levels among the gate electrodes, may be more difficult because the GSLs may directly contact the semiconductor pattern.

SUMMARY

Example embodiments may provide a vertical non-volatile memory device having good electrical characteristics.

Example embodiments may provide a method of forming a vertical non-volatile memory device having good electrical characteristics.

According to example embodiments, there is provided a method of forming a semiconductor device. In the method, a channel recess is formed in a stack of alternating insulation layers and sacrificial layers. A first channel material is formed in the channel recess. A charge storage structure is formed on the first channel material, in the channel recess. A second channel material is formed on opposing sidewalls of the charge storage structure, in the channel recess. The sacrificial layers are removed from the stack to expose a sidewall of the first channel material. The sidewall of the first channel material is oxidized via an oxide growth process to form a gate insulation layer. A gate electrode is formed in a recess adjacent a sidewall of the gate insulation layer. The gate insulation layer is between the first channel material and the gate electrode.

In example embodiments, when the sidewall of the first channel material is oxidized, the gate insulation layer may be grown to protrude into a portion of the recess.

In example embodiments, the portion of the recess into which the gate insulation layer protrudes may include a first portion of the recess, and when the gate electrode is formed, the gate electrode may be formed in a second portion of the recess that is free of the gate insulation layer.

In example embodiments, when the gate electrode is formed, tungsten adjacent the sidewall of the gate insulation layer may be deposited in the second portion of the recess that is free of the gate insulation layer.

In example embodiments, when the tungsten is deposited, the tungsten on the sidewall of the gate insulation layer may be deposited in the second portion of the recess that is free of the gate insulation layer, such that the gate electrode and the gate insulation layer may be laterally adjacent and vertically non-overlapping.

In example embodiments, when the sidewall of the first channel material is oxidized, a portion of the first channel material may be converted into an oxide layer while blocking the second channel material from oxidation.

In example embodiments, a blocking layer pattern may be further formed in recesses between the insulation layers, after removing the sacrificial layers.

In example embodiments, the blocking layer pattern may be confined to the recesses.

In example embodiments, when the gate electrode is formed, a gate selection line may be formed in the recess adjacent the sidewall of the gate insulation layer, and the gate insulation layer may be between the first channel material and the gate selection line.

In example embodiments, the recess may include a first recess, the gate selection line may include a first gate selection line, and when the gate selection line is formed, the first gate selection line may be formed in the first recess, and a second gate selection line may be formed in a second recess that overlaps the first recess.

In example embodiments, the first and second channel materials may include a same semiconductor material.

In example embodiments, when the first channel material is formed, a Selective Epitaxial Growth (SEG) process may be performed to form the first channel material in the channel recess, and when the oxidation is performed, the oxide growth process may be performed on the sidewall of the first channel material formed by the SEG process to form the gate insulation layer.

In example embodiments, an opening may be further formed in the stack after forming the second channel material. When the sacrificial layers are removed, the sacrificial layers may be removed after forming the opening, and when the oxidation is performed via the oxide growth process, a wet oxidation process may be performed via the opening.

In example embodiments, when the wet oxidation process is performed, the gate insulation layer may be formed by performing an In Situ Steam Generation (ISSG) process via the opening.

In example embodiments, the stack may be further formed on a substrate. When the opening is formed in the stack, a surface of the substrate may be exposed. The gate insulation layer may include a first insulation layer. When the wet oxidation process is performed via the opening, a second insulation layer may be grown on the surface of the substrate.

In example embodiments, when the second insulation layer is grown on the surface of the substrate, a non-planar interface of the second insulation layer with the substrate may be formed.

According to example embodiments, there is provided a method of forming a semiconductor device. In the method, a first semiconductor channel material is formed in the plurality of channel recesses. Charge storage structures are formed in respective ones of the plurality of channel recesses, on the first semiconductor channel material. A second semiconductor channel material is formed on sidewalls of the charge storage structures, in the plurality of channel recesses. The sacrificial layers are removed from the stack to form recesses that expose sidewalls of the first semiconductor channel material. A wet oxidation process is performed on the sidewalls of the first semiconductor channel material to form a gate insulation layer. Gate electrodes are formed in respective ones of the recesses, and the gate insulation layer is between the first semiconductor channel material and the gate electrodes.

According to example embodiments, there is provided a method of forming a semiconductor device. In the method, a stack of alternating insulation layers and sacrificial layers is formed on a substrate. A channel recess is formed in the stack to expose a first portion of the substrate. A first channel material is formed on the first portion of the substrate, in the channel recess. A charge storage structure is formed on the first channel material, in the channel recess. A second channel material is formed on opposing sidewalls of the charge storage structure, in the channel recess. An opening is formed in the stack to expose a second portion of the substrate. The sacrificial layers are removed from the stack to expose a sidewall of the first channel material, after forming the opening the stack. A wet oxidation process is performed on the sidewall of the first channel material to form a first insulation layer, and on the second portion of the substrate to form a second insulation layer. An interface of the second insulation layer with the substrate is non-planar. A gate electrode is formed in a recess adjacent a sidewall of the first insulation layer. The first insulation layer includes a gate insulation layer that is between the first channel material and the gate electrode.

According to example embodiments, there is provided a semiconductor device. The semiconductor device includes a stack of alternating insulation layers and gate electrodes. The semiconductor device includes a first channel material in a channel recess in the stack. The semiconductor device includes a charge storage structure on the first channel material, in the channel recess. The semiconductor device includes a second channel material on opposing sidewalls of the charge storage structure, in the channel recess. Moreover, the semiconductor device includes a gate insulation layer on a sidewall of the first channel material. The gate insulation layer is between the first channel material and a nearest one of the gate electrodes to the gate insulation layer. The gate insulation layer and the nearest one of the gate electrodes are laterally adjacent, and the gate insulation layer undercuts a portion of the first channel material.

In example embodiments, the gate insulation layer may include an oxide layer, and the nearest one of the gate electrodes may include a gate selection line.

In example embodiments, the oxide layer may protrude from the first channel material to extend between portions of adjacent ones of the insulation layers.

In example embodiments, the adjacent ones of the insulation layers may include first and second oxide layers, and the oxide layer may include a third oxide layer that protrudes from the first channel material to extend between portions of the first and second oxide layers.

In example embodiments, the semiconductor device may further include a substrate underlying the stack. The gate selection line may be closer to a surface of the substrate than non-gate-selection-line ones of the gate electrodes are to the surface of the substrate.

In example embodiments, the semiconductor device may further include an insulation layer on a portion of the substrate that is spaced apart from the first channel material. An interface of the insulation layer with the portion of the substrate may be non-planar.

In example embodiments, the gate selection line may include a first gate selection line. The semiconductor device may further include a second gate selection line that overlaps the first gate selection line.

In example embodiments, a lowermost surface of the charge storage structure may be farther from the surface of the substrate than an uppermost surface of the second gate selection line is to the surface of the substrate.

In example embodiments, the nearest one of the gate electrodes may extend between adjacent ones of the insulation layers. The adjacent ones of the insulation layers may include first and second oxide layers. The gate insulation layer may include a third oxide layer.

In example embodiments, the semiconductor device may further include a blocking layer pattern between the insulation layers.

In example embodiments, the first and second channel materials may include a same semiconductor material.

In example embodiments, the gate electrodes may include tungsten.

In example embodiments, the gate insulation layer and the nearest one of the gate electrodes may be vertically non-overlapping.

In example embodiments, the first channel material may include a Selective Epitaxial Growth (SEG) channel material. The portion of the first channel material that the gate insulation layer undercuts may include a first portion of the SEG channel material. The gate insulation layer may overlap a second portion of the SEG channel material.

According to example embodiments, there is provided a semiconductor device. The semiconductor device includes a stack of alternating insulation layers and gate electrodes. The semiconductor device includes a substrate underlying the stack. The semiconductor device includes a first channel material in a channel recess in the stack. The semiconductor device includes a charge storage structure on the first channel material, in the channel recess. The semiconductor device includes a second channel material on opposing sidewalls of the charge storage structure, in the channel recess. The semiconductor device includes a first insulation layer on a sidewall of the first channel material, and a second insulation layer on a portion of the substrate that is spaced apart from the first channel material. The first insulation layer includes a gate insulation layer that is between the first channel material and a nearest one of the gate electrodes to the gate insulation layer. The gate insulation layer and the nearest one of the gate electrodes are laterally adjacent. Moreover, the gate insulation layer undercuts a portion of the first channel material, and an interface of the second insulation layer with the portion of the substrate is non-planar.

In example embodiments, the gate insulation layer and the nearest one of the gate electrodes may be vertically non-overlapping.

In example embodiments, adjacent ones of the insulation layers may include first and second oxide layers. The gate insulation layer may include a third oxide layer that protrudes from the first channel material to extend between portions of the first and second oxide layers.

According to example embodiments, there is provided a semiconductor device. The semiconductor device includes a substrate. The semiconductor device includes a stack of alternating oxide layers and gate electrodes on the substrate. The semiconductor device includes a first channel material in a channel recess in the stack. The semiconductor device includes a charge storage structure on the first channel material, in the channel recess. The semiconductor device includes a second channel material on opposing sidewalls of the charge storage structure, in the channel recess. Moreover, the semiconductor device includes a gate insulation layer on the first channel material. The gate insulation layer is between the first channel material and a closest one of the gate electrodes to the substrate. The gate insulation layer undercuts a first portion of the first channel material and overlaps a second portion of the first channel material.

In example embodiments, the closest one of the gate electrodes may extend between adjacent ones of the oxide layers. The adjacent ones of the oxide layers may include first and second oxide layers. The gate insulation layer may include a third oxide layer.

In example embodiments, the semiconductor device may further include an insulation layer on a portion of the substrate that is spaced apart from the first channel material. An interface of the insulation layer with the portion of the substrate may be non-planar.

In various embodiments according to present inventive concepts, a method of forming a semiconductor device may include forming a gate insulation layer between a lower channel and a GSL (instead of merely forming a gate insulation layer adjacent a charge storage structure), and a transistor including the GSL may therefore have a desired/required breakdown voltage.

BRIEF DESCRIPTION OF THE DRAWINGS

Example embodiments will be more clearly understood from the following detailed description taken in conjunction with the accompanying drawings. FIGS. 1-20 represent non-limiting, example embodiments as described herein.

FIGS. 1, 2A and 2B are a plan view and cross-sectional views illustrating a vertical memory device in accordance with example embodiments;

FIGS. 3 to 14 are cross-sectional views illustrating stages of a method of manufacturing a vertical memory device in accordance with example embodiments;

FIG. 15 is a cross-sectional view illustrating a vertical memory device in accordance with example embodiments;

FIGS. 16 to 18 are cross-sectional views illustrating stages of a method of manufacturing a semiconductor device in accordance with example embodiments;

FIG. 19 is a cross-sectional view illustrating a vertical memory device in accordance with example embodiments; and FIG. 20 is a cross-sectional view illustrating a vertical memory device in accordance with example embodiments.

DETAILED DESCRIPTION

Figure 3:
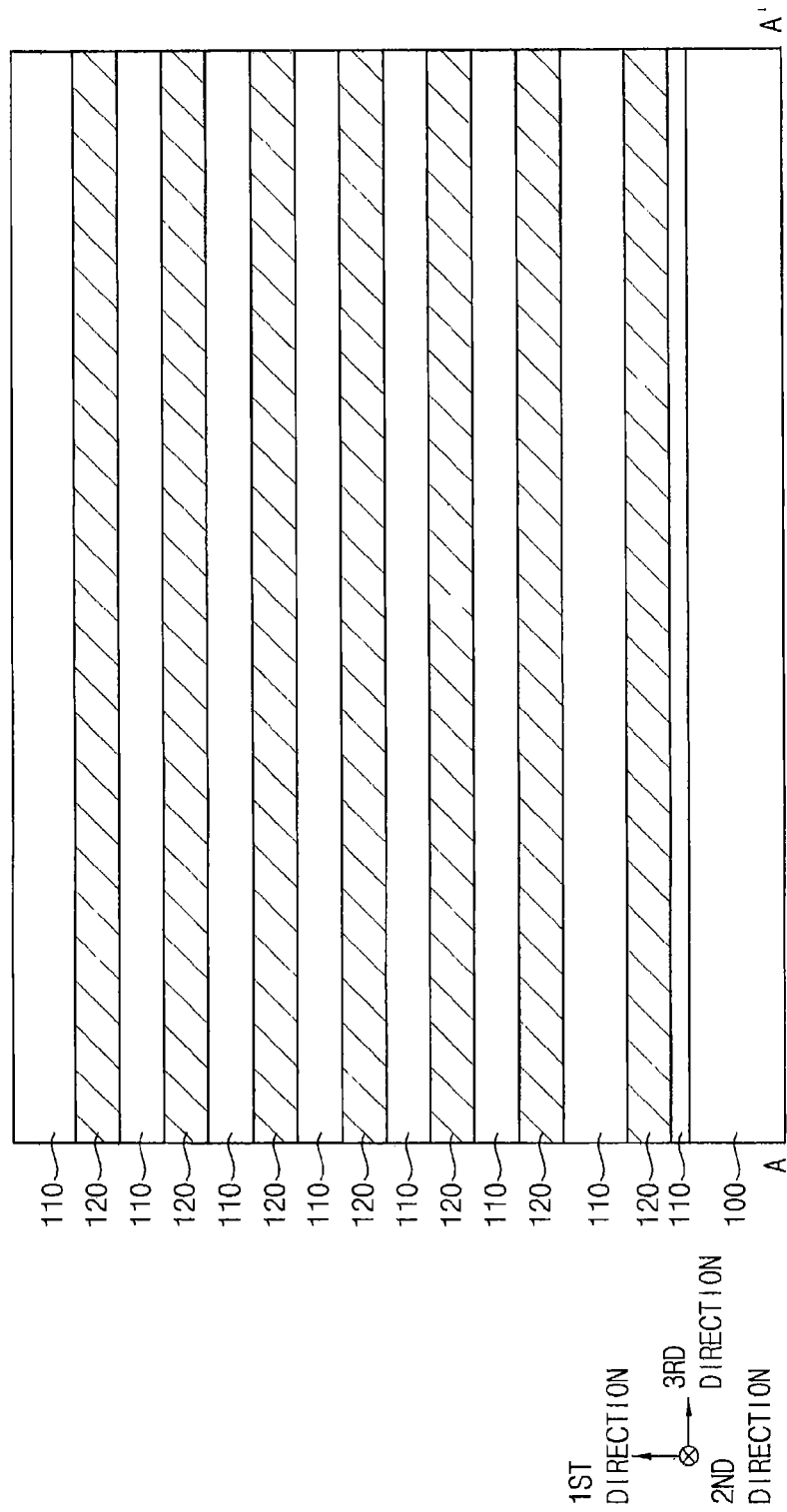

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIGS. 1, 2A and 2B are a plan view and cross-sectional views illustrating a vertical memory device in accordance with example embodiments. Particularly, FIG. 2A is a cross-sectional view of the semiconductor device in FIG. 1 taken along a line A-A', and FIG. 2B is an enlarged cross-sectional view of a region X of the semiconductor device in FIG. 1.

In all figures in this specification, a direction substantially perpendicular to a top surface of a substrate is referred to as a first direction, and two directions substantially parallel to the top surface of the substrate and substantially perpendicular to each other are referred to as second and third directions, respectively.

Referring to FIGS. 1, 2A and 2B, the vertical memory device may include a first structure, a gate electrode structure, and a gate insulation layer 270 on a substrate 100. The vertical memory device may further include a capping layer pattern 230, a second blocking layer 280, first and second insulation layer patterns 115 and 277, a second spacer 320, a common source line (CSL) 330, first to fourth insulating interlayers 130, 240, 340, 360, a contact plug 350, and a bit line 370.

The substrate 100 may include a semiconductor material, for example, silicon, germanium, or the like. The second insulation layer pattern 277 may have a non-planar interface with a portion/surface of the substrate 100. Moreover, the words "non-planar interface," as used herein, may refer to a sloped or curved interface.

The first structure may include a lower channel 150 protruding from a top surface of the substrate 100 in the first direction, an upper channel 210 extending in the first direction from a central top surface of the lower channel 150, a charge storage layer structure 195 covering an outer sidewall of the upper channel 210 on the lower channel 150, and a filling layer pattern 220 filling an inner space formed by the upper channel 210.

The lower channel 150 may have a pillar shape, for example, a solid cylindrical shape, and a recess may be formed on a sidewall of the lower channel 150, which may surround the sidewall of the lower channel 150 in a direction substantially horizontal to the top surface of the substrate 100. The lower channel 150 may be formed by partially removing an upper portion of the substrate 100 to form a trench, and filling the trench to protrude from the top surface of the substrate 100, and thus may be formed through the upper portion of the substrate 100.

The lower channel 150 may include a single crystalline semiconductor material, for example, single crystalline silicon or single crystalline germanium that may be doped with n-type or p-type impurities.

In example embodiments, the upper channel 210 may have a cup-like shape on the lower channel 150, and the filling layer pattern 220 may fill the inner space by the upper channel 210. Thus, a bottom surface and a sidewall of the filling layer pattern 220 may be covered by the upper channel 210. Alternatively, the upper channel 210 may have a pillar shape on the lower channel 150, and in this case, no filling layer pattern may be formed.

The upper channel 210 may include polysilicon or single crystalline silicon, and the filling layer pattern 220 may include an oxide, for example, silicon oxide.

In example embodiments, the charge storage layer structure 195 covering the outer sidewall of the upper channel 210 may have a cup-like shape of which a central bottom may be opened. The charge storage layer structure 195 may include a tunnel insulation layer pattern 185, a charge storage layer pattern 175 and a first blocking layer pattern 165 sequentially stacked on the outer sidewall of the upper channel 210 in the horizontal direction.

The tunnel insulation layer pattern 185 may include an oxide, for example, silicon oxide, the charge storage layer pattern 175 may include a nitride, for example, silicon nitride, and the first blocking layer pattern 165 may include an oxide, for example, silicon oxide.

The first structure including the lower channel 150, the upper channel 210, the charge storage layer structure 195 and the filling layer pattern 220 may have a pillar shape, for example, a solid cylindrical shape extending in the first direction from the top surface of the substrate 100, and the recess may be formed on a lower sidewall of the first structure at which the lower channel 150 may be formed. The first structure may have a diameter that may be substantially constant in the first direction or gradually increase from a bottom portion toward a top portion thereof in the first direction.

The capping layer pattern 230 may be formed on a top surface of the first structure, and the contact plug 350 may be formed on a top surface of the capping layer pattern 230.

In example embodiments, a plurality of first structures each including the lower and upper channels 150 and 210 may be formed both in the second and third directions, and thus a first structure array may be defined. Hereinafter, a channel array defined by the upper channel 210 and/or the lower channel 150 included in the first structure will be illustrated.

In example embodiments, the channel array may include a first channel column 210a containing a plurality of first upper channels 210 disposed in the second direction, and a second channel column 210b, which may contain a plurality of second upper channels 210 disposed in the second direction and be spaced apart from the first channel column 210a in the third direction at a given distance. The first upper channels 210 may be positioned in a direction, which may be an acute angle to the second direction or the third direction, from the second upper channels 210. Accordingly, the first and second channels 210 may be arranged in a zigzag pattern with respect to the second direction, and thus more upper channels 210 may be arranged in a given area.

The first and second channel columns 210a and 210b may be alternately and repeatedly formed in the third direction. In example embodiments, the first and second channel columns 210a and 210b may be arranged in the third direction twice, which may form a channel block totally including four channel columns. Additionally, a plurality of channel blocks may be formed to be spaced apart from each other in the third direction by an opening 250 in which the CSL 330 may be formed. Hereinafter, the four channel columns disposed in each channel block may be referred to as first, second, third and fourth channel columns 210a, 210b, 210c and 210d, respectively.

That is, FIG. 1 shows that a plurality of channel blocks are spaced apart from each other in the third direction by first, second and third openings 250a, 250b and 250c in which first, second and third CSLs 330a, 330b and 330c may be formed, respectively, and that each of the channel blocks includes the first, second, third and fourth channel columns 210a, 210b, 210c and 210d disposed in the third direction in this order. However, present inventive concepts may not be limited thereto, and each channel block may include other numbers of channel columns.

Alternatively, the channel array may include a plurality of upper channels 210 that may not be arranged in the zigzag pattern.

The gate insulation layer 270 may have a ring shape that may fill the recess on the lower sidewall of the first structure, i.e., on the sidewall of the lower channel 150, and may protrude from the sidewall of the first structure in the horizontal direction.

In example embodiments, the gate insulation layer 270 may include a first portion 270a contacting the sidewall of the lower channel 150 on which the recess is formed and having a first diameter R1 from a center of the lower channel 150, and a second portion 270b contacting the first portion 270a and having a second diameter R2 from the center of the lower channel 150 greater than the first diameter R1.

In example embodiments, a top surface of the second portion 270b of the gate insulation layer 270 may be lower than a top surface of the first portion 270a of the gate insulation layer 270, and a bottom surface of the second portion 270b of the gate insulation layer 270 may be higher than a bottom surface of the first portion 270a of the gate insulation layer 270.

In example embodiments, the first portion 270a of the gate insulation layer 270 may have a first thickness T1 in the horizontal direction gradually decreasing from a central portion toward a top portion or a bottom portion thereof, and the second portion 270b of the gate insulation layer 270 may have a second thickness T2 in the horizontal direction that may be substantially constant in the first direction.

The gate electrode structure may include a plurality of gate electrodes that may be formed at a plurality of levels spaced apart from each other in the first direction and may surround the sidewall of the first structure. The gate electrode structure may extend in the second direction, and a plurality of gate electrode structures may be formed in the third direction. The plurality of gate electrode structures each extending in the second direction may be spaced apart from each other in the third direction by the opening 250 in which the CSL 330 and the second spacer 320 each extending in the second direction may be formed, and thus the gate electrode structures may correspond to the channel blocks, respectively.

Each of the gate electrode structures may include at least one first gate electrode 313, at least one second gate electrode 315, and at least one third gate electrode 317 that may be sequentially stacked in the first direction on the substrate 100.

In example embodiments, the first gate electrode 313 may serve as a ground select/selection line (GSL), the second gate electrode 315 may serve as a word line, and the third gate electrode 317 may serve as a string select/selection line (SSL). In an example embodiment, the first gate electrode 313 may be formed at one level, the second gate electrode 315 may be formed at a plurality of levels, for example, at even numbers of levels, and the third gate electrode 317 may be formed at two levels, however, present inventive concepts may not be limited thereto.

The first gate electrode 313 serving as the GSL may face the gate insulation layer 270 at the sidewall of the lower channel 150, and the second and third gate electrodes 315 and 317 serving as the word line and the SSL, respectively, may face the charge storage layer structure 195 at the outer sidewall of the upper channel 210.

The first gate electrode 313 may include a first gate conductive pattern 303 extending in the second direction, and a first gate barrier layer pattern 293 covering a top portion and a bottom portion of the first gate conductive pattern 303, and a sidewall of the first gate conductive pattern 303 facing a sidewall of the gate insulation layer 270. The second gate electrode 315 may include a second gate conductive pattern 305 extending in the second direction, and a second gate barrier layer pattern 295 covering a top portion and a bottom portion of the second gate conductive pattern 305, and a sidewall of the second gate conductive pattern 305 facing a sidewall of the charge storage layer structure 195. The third gate electrode 317 may include a third gate conductive pattern 307 extending in the second direction, and a third gate barrier layer pattern 297 covering a top portion and a bottom portion of the third gate conductive pattern 307, and a sidewall of the third gate conductive pattern 307 facing a sidewall of the charge storage layer structure 195.

The first to third gate conductive patterns 303, 305 and 307 may include a metal with a low electrical resistance, for example, tungsten, titanium, tantalum, platinum, or the like. The first to third gate barrier layer patterns 293, 295 and 297 may include a conductive metal nitride, for example, titanium nitride, tantalum nitride, or the like. Alternatively, the first to third gate barrier layer patterns 293, 295 and 297 may include a first layer of a metal and a second layer of a metal nitride sequentially stacked.

The first insulation layer pattern 115 may be formed between the gate electrodes 313, 315 and 317 spaced apart from each other in the first direction. The first insulation layer pattern 115 at each level may cover the sidewall of the first structure and extend in the second direction, and a plurality of first insulation layer patterns 115 may be formed in the third direction at each level. In example embodiments, each first insulation layer pattern 115 may have a length in the third direction greater than a length of each of the gate electrodes 313, 315 and 317. That is, the gate electrodes 313, 315 and 317 may partially fill gaps between the first insulation layer patterns 115 sequentially stacked in the first direction, and thus the length of each of the gate electrodes 313, 315 and 317 may be less than the length of each of the first insulation layer patterns 115.

However, the second insulation layer pattern 277 may be formed between the first gate electrode 313 and the top surface of the substrate 100. In example embodiments, the second insulation layer pattern 277 may include a first portion 277a extending in the third direction from the CSL 330 in each of the openings 250a, 250b and 250c or from an end portion of the first gate electrode 313 in the third direction, a second portion 277b contacting the first portion 277a and extending in the first direction from the first portion 277a toward an inner portion of the substrate 100, and a third portion 277c contacting the second portion 277b and extending in the third direction from the second portion 277b.

A third thickness T3 of the first portion 277a of the second insulation layer pattern 277 in the first direction may gradually decrease in the third direction when receding from the CSL 330 or moving from the end portion of the first gate electrode 313 toward a central portion of the first gate electrode 313. That is, a height of a top surface of the first portion 277a of the second insulation layer pattern 277 may be substantially constant in the third direction, and a height of a bottom surface of the first portion 277a of the second insulation layer pattern 277 may gradually increase when receding from the CSL 330 or moving from the end portion of the first gate electrode 313 toward the central portion of the first gate electrode 313.

In example embodiments, a fourth thickness T4 in the third direction of the second portion 277b of the second insulation layer pattern 277 may be greater than a fifth thickness T5 in the first direction of the third portion 277c of the second insulation layer pattern 277.

In some embodiments, the first insulation layer pattern 115 instead of the second insulation layer pattern 277 may be formed between the first gate electrode 313 and the top surface of the substrate 100. As will be illustrated with reference to FIGS. 10A and 10B later, the second insulation layer pattern 277 may be formed by the oxidation of an upper portion of the substrate 100, and may be merged into the first insulation layer pattern 115 already formed on the top surface of the substrate 100 to have a volume greater than a volume of the initial first insulation layer pattern 115, which may be referred to as the second insulation layer pattern 277. However, not all portions of the first insulation layer pattern 115 on the top surface of the substrate 100 may be oxidized, and thus a portion of the first insulation layer pattern 115 may not be merged into the second insulation layer pattern 277. An upper portion of the substrate 100 far from the openings 250a, 250b and 250c or the CSL 330 may not be oxidized, and thus the first insulation layer pattern 115 on the upper portion of the substrate 100 may not be merged into the second insulation layer pattern 277, but may remain to have the initial volume.

For example, an upper portion of the substrate 100 between the first opening 250a and the first and second channel columns 210a and 210b, or an upper portion of the substrate 100 between the second opening 250b and the third and fourth channel columns 210c and 210d may be oxidized to form the second insulation layer pattern 277, which may be merged with the first insulation layer pattern 115. However, an upper portion of the substrate 100 between the first channel column 210a and the third channel column 210c, or an upper portion of the substrate 100 between the second channel column 210b and the fourth channel column 210d may not be oxidized, and thus the insulation layer pattern 115 on the above upper portions of the substrate 100 may have the initial volume.

A top portion and a bottom portion of each of the gate electrodes 313, 315 and 317, and a sidewall of each of the gate electrodes 313, 315 and 317 corresponding to the gate insulation layer 270 or the charge storage layer structure 195 may be covered by the second blocking layer 280. Thus, the gate insulation layer 270, the second blocking layer 280, and the first gate electrode 313 may be sequentially stacked on the sidewall of the lower channel 150 in the horizontal direction, and the tunnel insulation layer pattern 185, the charge storage layer pattern 175, the first blocking layer pattern 165, the second blocking layer 280, and the second gate electrode 315 or the third gate electrode 317 may be sequentially stacked on the outer sidewall of the upper channel 210 in the horizontal direction.

The second blocking layer 280 may be also formed on a sidewall of each of the first insulation layer patterns 115 not corresponding to the first structure, and on a top surface of the second insulation layer pattern 277.

The second blocking layer 280 may include, a metal oxide, for example, aluminum oxide, hafnium oxide, lanthanum oxide, lanthanum aluminum oxide, lanthanum hafnium oxide, hafnium aluminum oxide, titanium oxide, tantalum oxide, zirconium oxide, or the like.

The CSL 330 may be formed in the opening 250 exposing a top surface of the substrate 100 and extending in the second direction, and thus may extend in the second direction. The CSL 330 may also extend in the first direction. The CSL 330 may include a metal, a metal nitride and/or a metal silicide.

In example embodiments, a lower portion of the CSL 330 may contact a sidewall of the second insulation layer pattern 277, and an end portion of the CSL 330 may be formed through an upper portion of the substrate 100. Thus, the end portion of the CSL 330 may be surrounded by an impurity region 105 at an upper portion of the substrate 100. In example embodiments, the impurity region 105 may be doped with n-type impurities, for example, phosphorus, arsenic, or the like.

In example embodiments, the CSL 330 may have a plurality of protrusions at portions thereof adjacent to the gate electrodes 313, 315 and 317 in the third direction.

The second spacer 320 may be formed in the opening 250, and may cover both sidewalls of the CSL 330 in the third direction. The second spacer 320 may contact the second blocking layer pattern 280 and sidewalls of the gate electrodes 313, 315 and 317. Accordingly, as the CSL 330 has the protrusions adjacent to the gate electrodes 313, 315 and 317, the second spacer 320 may have recesses corresponding thereto, which may be concave in the third direction.

The capping layer pattern 230 may be formed on the top surface of the first structure, and a sidewall of the capping layer pattern 230 may be covered by an uppermost first insulation layer pattern 115 and the first insulating interlayer 130. The capping layer pattern 230 may include, for example, polysilicon or single crystalline silicon doped with impurities.

The first structure and the capping layer pattern 230 may define a second structure having a pillar shape, for example, a solid cylindrical shape, and a plurality of second structures may form a second structure block, and further a second structure array.

The second, third and fourth insulating interlayers 240, 340 and 360 may be sequentially stacked on the first insulating interlayer 130 and the capping layer pattern 230. The first to fourth insulating interlayers 130, 240, 340 and 360 may include an oxide, for example, silicon oxide, and some or all of the second, third and fourth insulating interlayers 240, 340 and 360 may be merged into a single layer.

The contact plug 350 may be formed through the second and third insulating interlayers 240 and 340, and contact a top surface of the second structure. The bit line 370 may be formed through the fourth insulating interlayer 360, and contact a top surface of the contact plug 350. In example embodiments, the bit line 370 may extend in the third direction.

Each of the contact plug 350 and the bit line 370 may have a conductive pattern including a metal, for example, copper, aluminum, tungsten, titanium, tantalum, or the like, and a barrier layer pattern including a metal nitride, for example, titanium nitride, tantalum nitride, tungsten nitride, or the like.

In the vertical memory device, the charge storage layer structure 195 may be formed between the upper channel 210 and the second gate electrode 315 and/or between the upper channel 210 and the third gate electrode 317, and thus a transistor including the word line or the SSL may have a sufficiently high breakdown voltage. However, no charge storage layer structure may be formed between the lower channel 150 and the first gate electrode 313, and thus a transistor including the GSL may not have a sufficiently high breakdown voltage. In example embodiments, the sidewall of the lower channel 150 may be oxidized to form the gate insulation layer 270 between the lower channel 150 and the first gate electrode 313, and thus the transistor including the GSL may also have a sufficiently high breakdown voltage.

FIGS. 3 to 14 are cross-sectional views illustrating stages of a method of manufacturing a vertical memory device in accordance with example embodiments. FIGS. 3 to 14 are cross-sectional views taken along a line A-A' in FIG. 1, and FIG. 10B is an enlarged cross-sectional view of a region X in FIG. 10A.

Referring to FIG. 3, an insulation layer 110 and a sacrificial layer 120 may be alternately and repeatedly formed on a substrate 100. A plurality of insulation layers 110 and a plurality of sacrificial layers 120 may be alternately formed on each other at a plurality of levels, respectively, in the first direction. FIG. 3 shows that eight insulation layers 110 and seven sacrificial layers 120 are alternately formed on the substrate 100, however, the numbers of the insulation layers 110 and the sacrificial layers 120 may not be limited thereto.

The substrate 100 may include a semiconductor material, for example, silicon, germanium, or the like.

The insulation layer 110 and the sacrificial layer 120 may be formed by, for example, a chemical vapor deposition (CVD) process, a plasma enhanced chemical vapor deposition (PECVD) process and/or an atomic layer deposition process (ALD) process. A lowermost insulation layer 110, which may be formed directly on a top surface of the substrate 100, may be formed by, for example, a thermal oxidation process, and thus may be formed to include, for example, silicon oxide.

In example embodiments, the insulation layer 110 may be formed to include a silicon oxide, for example, plasma enhanced tetra ethyl ortho silicate (PE-TEOS), high density plasma (HDP) oxide, plasma enhanced oxide (PEOX), or the like. The sacrificial layer 120 may be formed to include a material having an etching selectivity with respect to the insulation layer 110, for example, silicon nitride.

Figure 4:
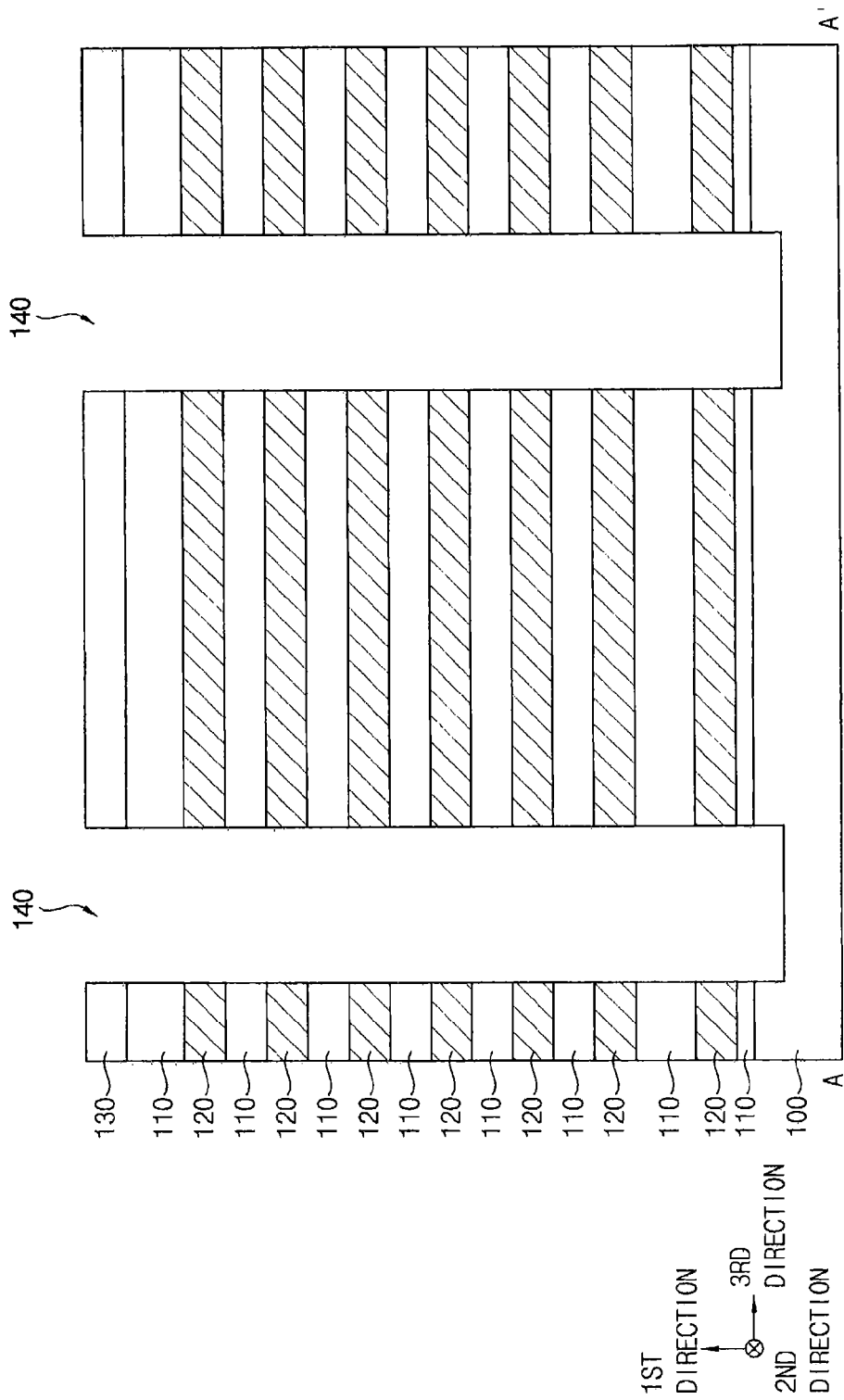

Referring to FIG. 4, after forming a first insulating interlayer 130 on an uppermost insulation layer 110, a photolithography process may be performed using a photoresist pattern as an etching mask to form a plurality of channel holes 140 through the insulation layers 110 and the sacrificial layers 120 exposing a top surface of the substrate 100. An upper portion of the substrate 100 may be also etched.

In example embodiments, each of the channel holes 140 may be formed to have, for example, a hollow cylindrical shape. However, due to the characteristics of the etching process, a diameter of each channel hole 140 may gradually decrease from a top portion toward a bottom thereof. Moreover, as used herein, the words "channel recess" may include/refer to one of the channel holes 140, and the words "channel recesses" may include/refer to a plurality of the channel holes 140.

The first insulating interlayer 130 may be formed to include an oxide, for example, silicon oxide, and thus, in some embodiments, the first insulating interlayer 130 may be merged with the uppermost insulation layer 110.

Referring to FIG. 1 showing the channel columns 210a, 210b, 210c and 210d formed by the upper channels 210 and/or the lower channels 150 in the channel holes 140, a plurality of channel holes 140 may be formed both in the second and third directions, and thus may define a channel hole array. In example embodiments, the channel hole array may have a first channel hole column including a plurality of first channel holes 140 arranged in the second direction, and a second channel hole column including a plurality of second channel holes 140 arranged in the second direction and being spaced apart from the first channel hole column at a given distance. The first channel holes 140 may be positioned in a direction, which may have an acute angle with respect to the second direction or the third direction, from the second channel holes 140. Accordingly, the first and second channel holes 140 may be arranged in a zigzag pattern with respect to the second direction, and thus more channel holes may be formed in a given area.

The first and second channel hole columns may be alternately and repeatedly formed in the third direction. In example embodiments, the first and second channel hole columns may be arranged in the third direction twice, which may form a channel hole block totally including four channel hole columns. Additionally, a plurality of channel hole blocks may be formed to be spaced apart from each other in the third direction. Hereinafter, the four channel hole columns disposed in each channel hole block may be referred to as first, second, third and fourth channel hole columns, respectively. That is, FIG. 1 shows that a plurality of channel hole blocks is spaced apart from each other in the third direction, and that each of the channel hole blocks includes the first, second, third and fourth channel hole columns in the third direction in this order. However, present inventive concepts may not be limited thereto, and each channel hole block may include other numbers of channel hole columns.

Alternatively, the channel hole array may include a plurality of channel holes 140 that may not be arranged in the zigzag pattern.

Figure 5:
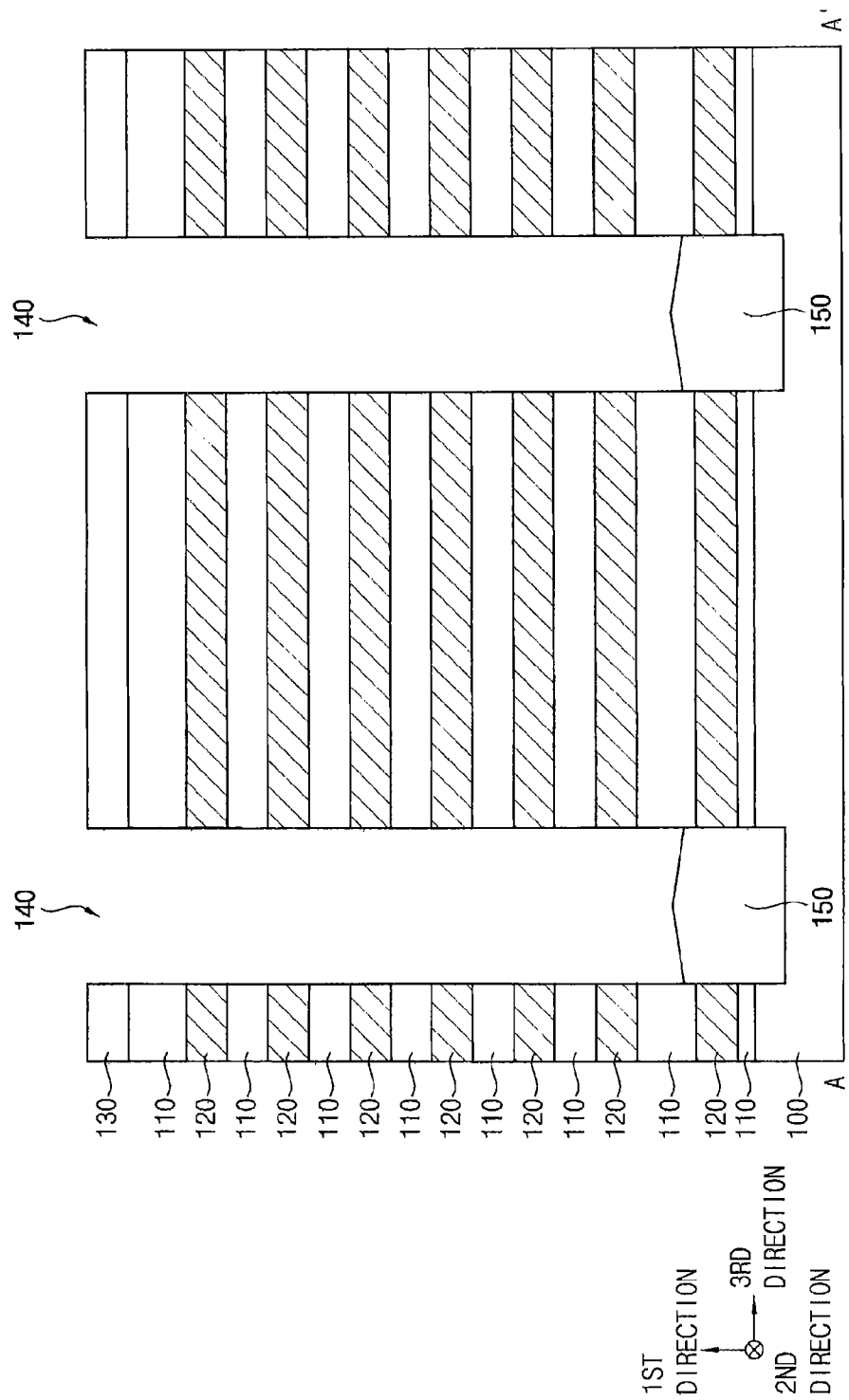

Referring to FIG. 5, a lower channel 150 may be formed to partially fill each channel hole 140.

Particularly, a selective epitaxial growth (SEG) process may be performed using the exposed top surface of the substrate 100 as a seed to form the lower channel 150 partially filling the channel hole 140. Thus, the lower channel 150 may be formed to include single crystalline silicon or single crystalline germanium according to the material of the substrate 100, and in some cases, n-type or p-type impurities may be doped thereinto. Alternatively, an amorphous silicon layer may be formed to fill the channel holes 140, and a laser epitaxial growth (LEG) process or a solid phase epitaxy (SPE) process may be performed on the amorphous silicon layer to form the lower channel 150.

In example embodiments, a top surface of the lower channel 150 may be formed at a height between a bottom surface and a top surface of one of the insulation layers 110 that may be stacked at a second level from the top surface of the substrate 100 among the plurality of levels at which the plurality of insulation layers 110 may be formed. The lower channel 150 may be formed to have a pillar shape, for example, a solid cylindrical shape, and a height of a central upper surface of the lower channel 150 may be greater than a height of a peripheral upper surface of the lower channel 150.

Figure 6:
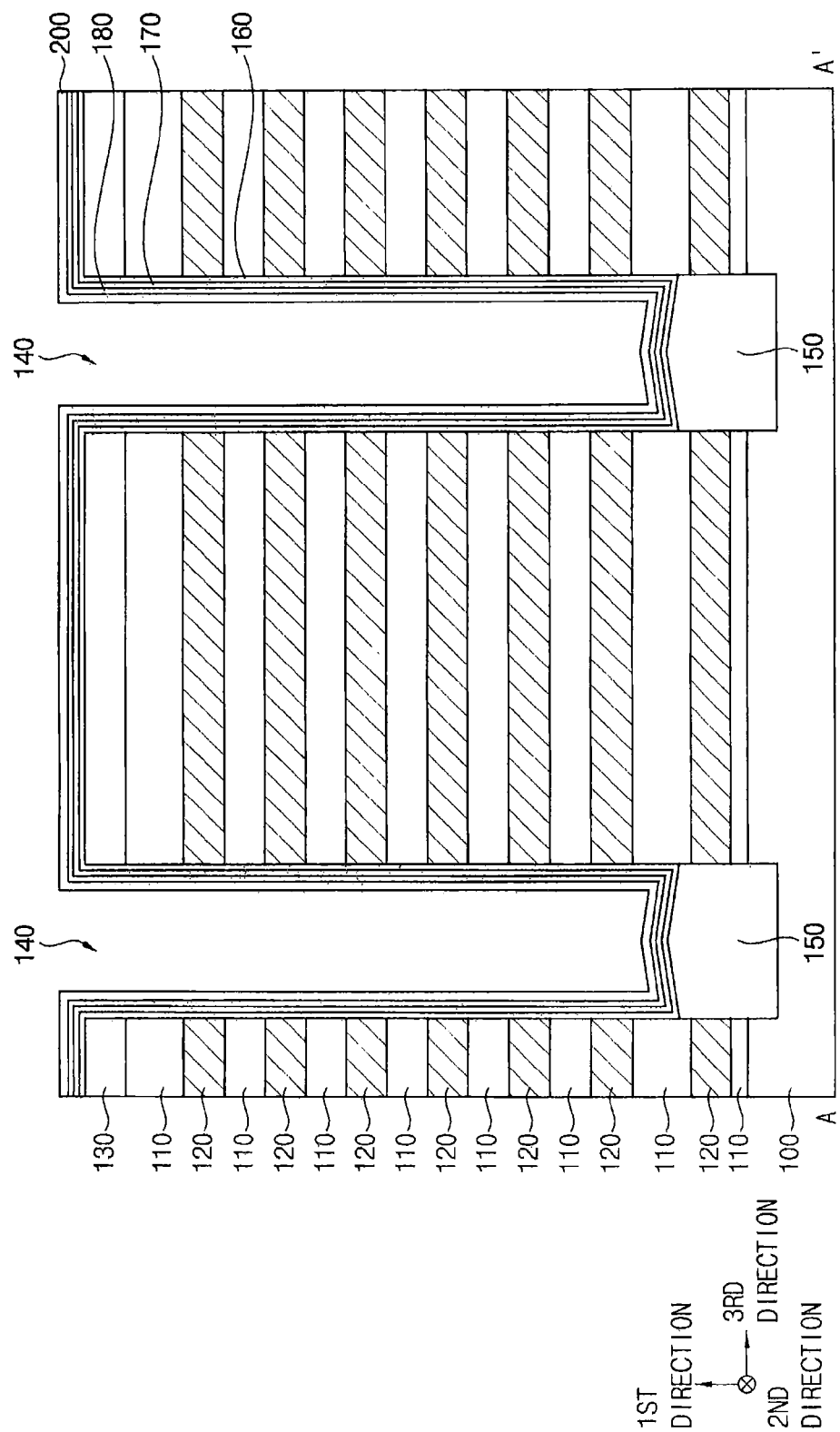

Referring to FIG. 6, a first blocking layer 160, a charge storage layer 170, a tunnel insulation layer 180 and a first spacer layer 200 may be sequentially formed on inner sidewalls of the channel holes 150, a top surface of the lower channel 150, and a top surface of the first insulating interlayer 130.

The first blocking layer 160 may be formed to include an oxide, for example, silicon oxide, the charge storage layer 170 may be formed to include a nitride, for example, silicon nitride, the tunnel insulation layer 180 may be formed to include an oxide, for example, silicon oxide, and the first spacer layer 200 may be formed to include a nitride, for example, silicon nitride.

Figure 7:
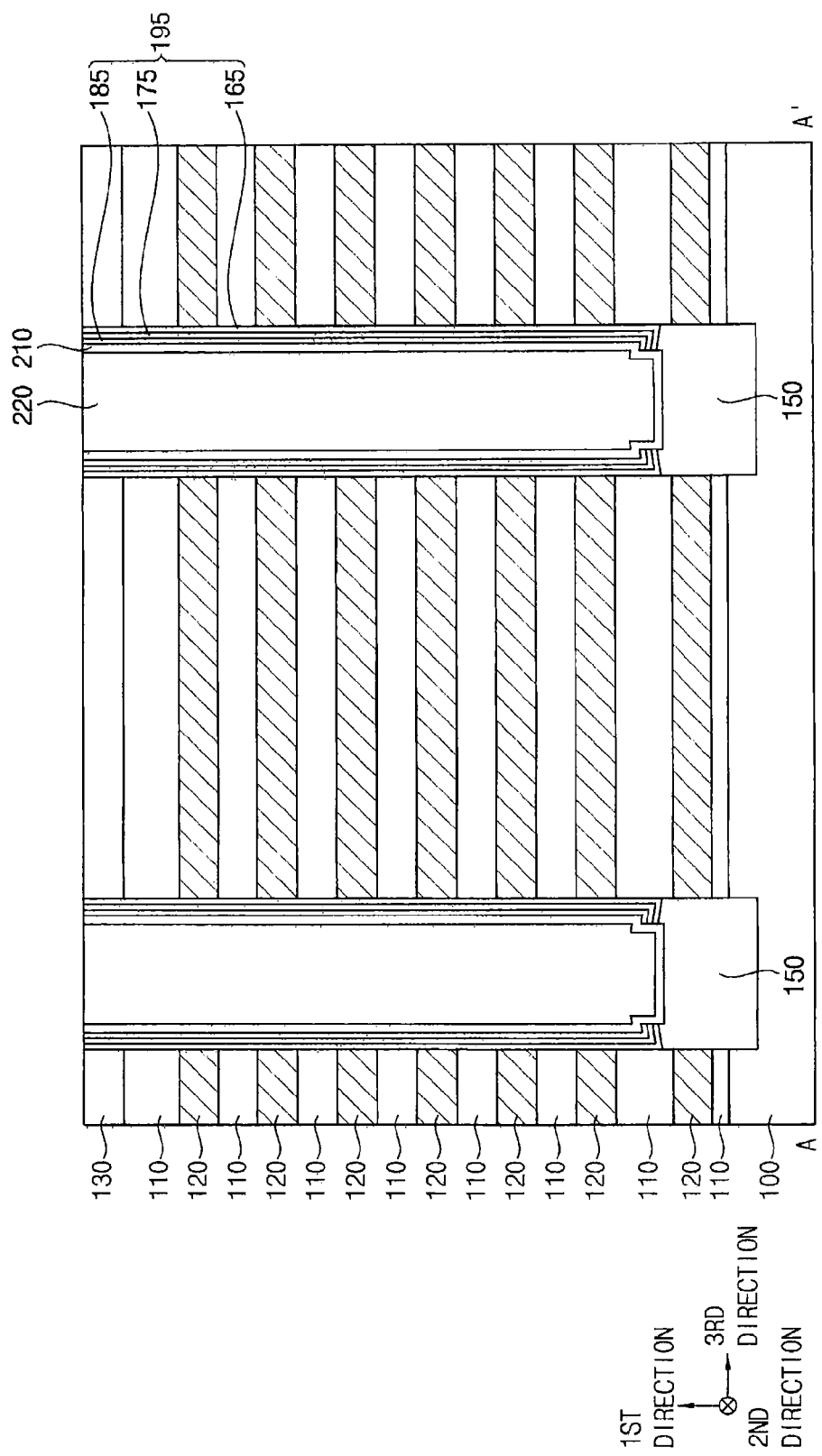

Referring to FIG. 7, the first spacer layer 200 may be anisotropically etched to form a first spacer on the inner sidewall of each channel hole 140, and the tunnel insulation layer 180, the charge storage layer 170 and the first blocking layer 160 may be sequentially etched using the first spacer as an etching mask to form a tunnel insulation layer pattern 185, a charge storage layer pattern 175 and a first blocking layer pattern 165, respectively, each having a cup-like shape of which a central bottom is opened, on the inner sidewall of each channel hole 140 and the top surface of the lower channel 150. Thus, a charge storage layer structure 195 having the tunnel insulation layer pattern 185, the charge storage layer pattern 175 and the first blocking layer pattern 165 may be formed. An upper portion of the lower channel 150 may be also etched in the etching process.

After removing the first spacer, a channel layer may be formed on the exposed top surface of the lower channel 150, the tunnel insulation layer pattern 185 and the first insulating interlayer 130, and a filling layer may be formed on the channel layer to sufficiently fill a remaining portion of the channel holes 140.

The channel layer may be formed to include polysilicon or amorphous silicon. When the channel layer is formed to include amorphous silicon, a crystallization process, for example, an LEG process or an SPE process may be further performed. The filling layer may be formed to include an oxide, for example, silicon oxide.

The filling layer and the channel layer may be planarized until a top surface of the first insulating interlayer 130 may be exposed to form a filling layer pattern 220 filling a remaining portion of each channel hole 140, and the channel layer may be transformed into the upper channel 210.

Thus, the charge storage layer structure 195, the upper channel 210 and the filling layer pattern 220 may be sequentially stacked on the lower channel 150 in each channel hole 140. The charge storage layer structure 195 may have a cup-like shape of which a bottom is opened, the upper channel 210 may have a cup-like shape, and the filling layer pattern 220 may have a pillar shape. That is, the filling layer pattern 220 having the pillar shape may fill a space formed by the upper channel 210 having the cup-like shape, and thus a bottom and a sidewall of the filling layer pattern 220 may be covered by the upper channel 210. Alternatively, the upper channel 210 may have a pillar shape filling a space formed by the charge storage layer structure 195 on the lower channel 150, and in this case, the filling layer pattern 220 may not be formed.

Accordingly, as the channel holes 140 may define the channel hole block including the first to fourth channel hole columns, and further the channel hole array including the plurality of channel hole blocks, the upper channel 210 together with the lower channel 150 may also define a channel block and a channel array, correspondingly. That is, the channel array may include a plurality of channel blocks spaced apart from each other in the third direction, and each channel block may include the first, second, third and fourth channel columns 210a, 210b, 210c and 210d (refer to FIG. 1).

The lower and upper channels 150 and 210, the charge storage layer structure 195 covering an outer sidewall of the upper channel 210, and the filling layer pattern 220 filling the space formed by the upper channel 210 may define a first structure having a pillar shape, for example, a solid cylindrical shape. Accordingly, as the channel block and the channel array may be defined, a first structure block and a first structure array may be also defined, correspondingly.

Figure 8:
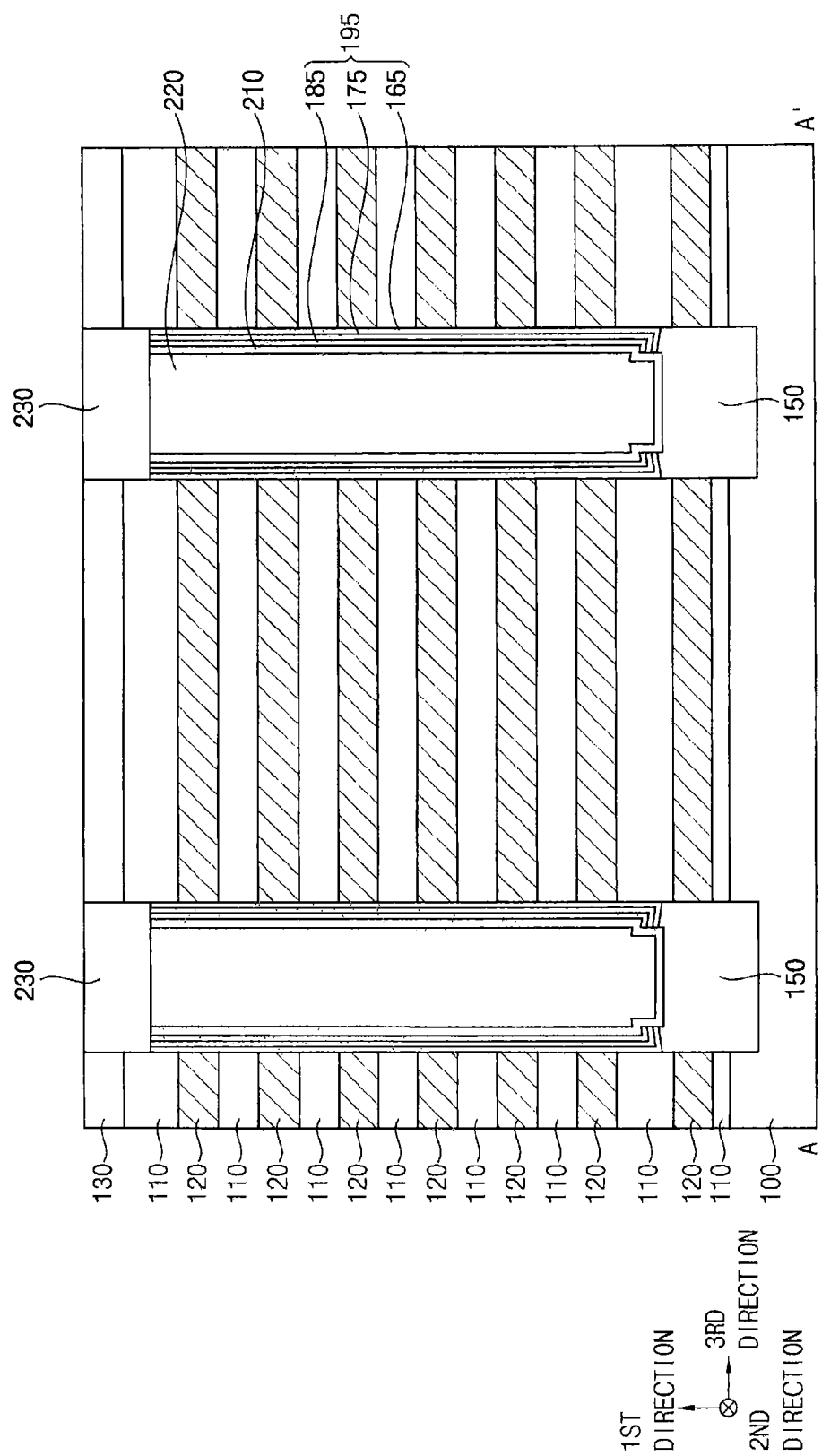

Referring to FIG. 8, an upper portion of the first structure may be removed to form a trench, and a capping layer pattern 23Q may be formed to fill the trench.

Particularly, after the upper portion of the first structure may be removed by an etch back process to form the trench, a capping layer may be formed on the first structure and the first insulating interlayer 130, and the capping layer may be planarized until the top surface of the first insulating interlayer 130 may be exposed to form the capping layer pattern 230. In example embodiments, the capping layer may be formed to include doped polysilicon or doped amorphous silicon. When the capping layer is formed to include doped amorphous silicon, a crystallization process may be further performed thereon.

The first structure and the capping layer pattern 230 in each channel hole 140 may define a second structure having a pillar shape, for example, a solid cylindrical shape, which may define a second structure block and a second structure array.

Referring to FIG. 9, after forming a second insulating interlayer 240 on the first insulating interlayer 130 and the capping layer pattern 230, an opening 250 may be formed through the first and second insulating interlayers 130 and 240, the insulation layers 110, and the sacrificial layers 120 to expose a top surface of the substrate 100. An upper portion of the substrate 100 may be also removed.

The second insulating interlayer 240 may be formed to include an oxide, for example, silicon oxide, and thus, in some embodiments, the second insulating interlayer 240 may be merged with the first insulating interlayer 130.

In example embodiments, a plurality of openings 250 may be formed in the first direction, and each opening 250 may extend in the second direction between the second structure blocks. Referring to FIG. 1, the first through fourth channel columns 210a, 210b, 210c and 210d may be formed between first and second openings 250a and 250b adjacent thereto, or between the second and third openings 250b and 250c adjacent thereto, however, present inventive concepts may not be limited thereto. That is, according to the numbers of the channel columns included in each channel block, the numbers of the channel columns between neighboring two openings 250 may be changed.

Accordingly, as the opening 250 may be formed to extend in the second direction, the insulation layer 110 may be transformed into a plurality of first insulation layer patterns 115 spaced apart from each other in the third direction. Each of the first insulation layer patterns 115 may extend in the second direction. The sacrificial layer 120 may be also transformed into a plurality of sacrificial layer patterns spaced apart from each other in the third direction, and each sacrificial layer pattern may extend in the second direction.

The sacrificial layer patterns exposed by the opening 250 may be removed to form a gap 260 between the first insulation layer patterns 115 at adjacent levels. In example embodiments, a plurality of gaps 260 may be formed between the first insulation layer patterns 115, respectively. Portions of an outer sidewall of the first blocking layer pattern 165 and a sidewall of the lower channel 150 may be exposed by the gap 260. In example embodiments, the sacrificial layer patterns exposed by the opening 250 may be removed by, for example, a wet etch process using an etching solution including phosphoric acid and/or sulfuric acid.

Figure 10A:
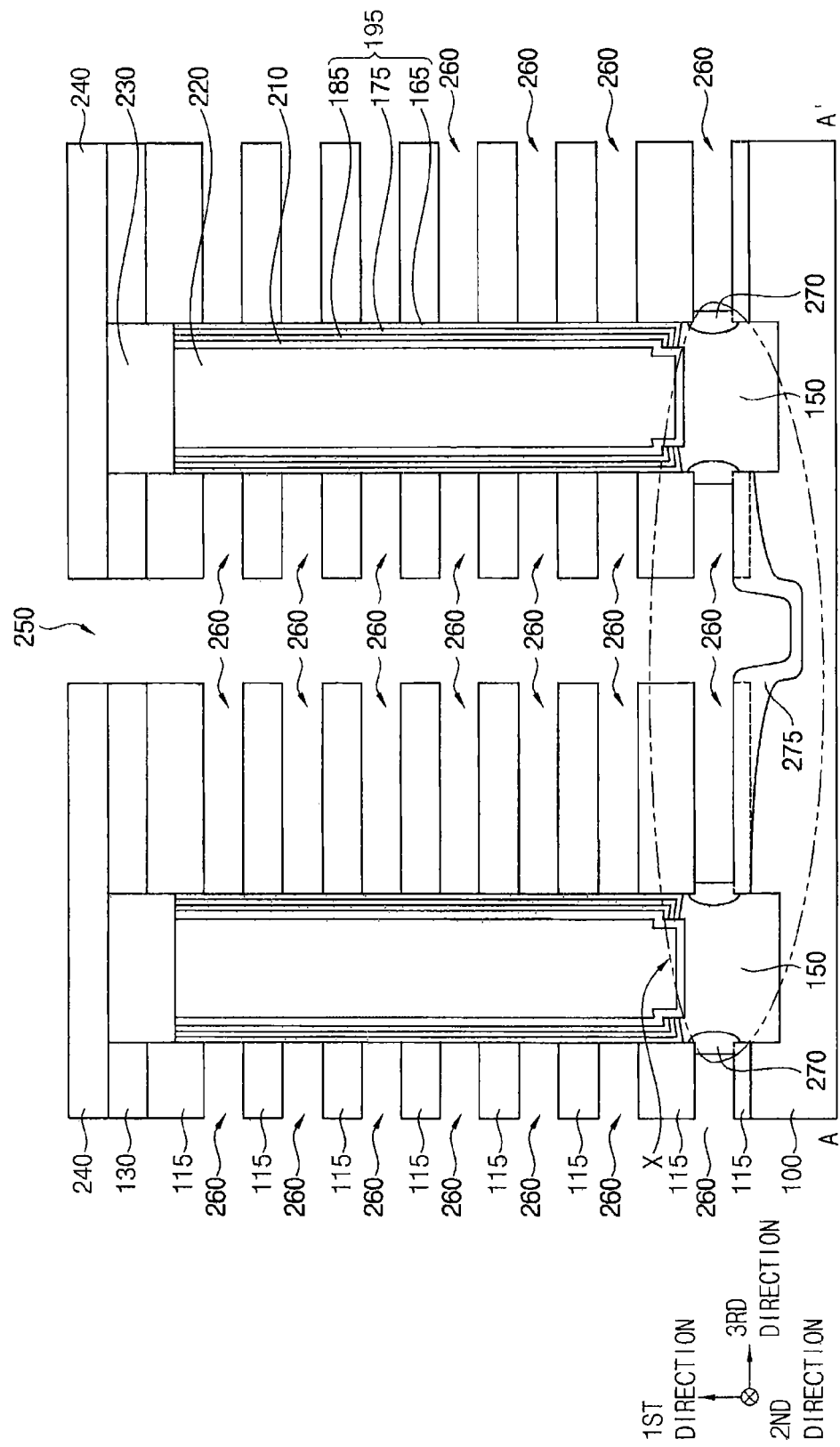
Figure 10B:
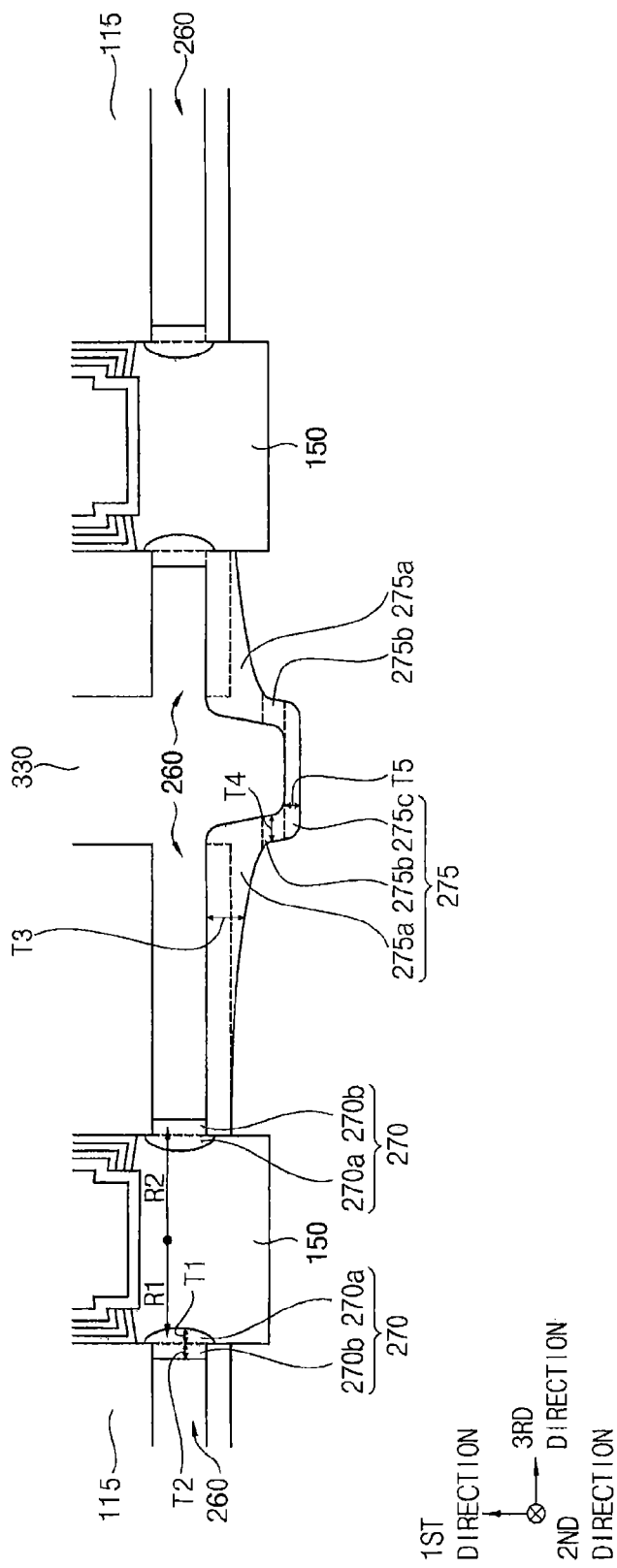

Referring to FIGS. 10A and 10B, the exposed sidewall(s) of the lower channel 150 may be oxidized to form a gate insulation layer 270.

In example embodiments, the oxide growth process on the lower channel 150 may be a non-deposition oxide growth process (i.e., it is not an oxide deposition process). For example, a wet oxidation process (rather than an oxide deposition process or a thermal oxidation process) may be performed by providing water vapor onto the substrate 100, so that the exposed sidewall of the lower channel 150 including a semiconductor material may be oxidized to form the gate insulation layer 270. Alternatively, a dry oxidation process may be performed by providing oxygen gas onto the substrate 100. The lower channel 150 may include, for example, silicon, and thus the sidewall of the lower channel 150 may be converted into a silicon oxide layer that may protrude from the sidewall of the lower channel 150 in a direction substantially horizontal to the top surface of the substrate 100.

Accordingly, a recess may be formed on the sidewall of the lower channel 150 having the pillar shape, for example, a solid cylindrical shape to surround the sidewall of the lower channel 150 in the horizontal (e.g., third) direction, and the gate insulation layer 270 may fill the recess. Further, the gate insulation layer 270 may not only fill the recess, but also protrude from the sidewall of the lower channel 150 in the horizontal direction. Thus, the gate insulation layer 270 may have a ring shape. That is, the gate insulation layer 270 may include a first portion 270a, which may fill the recess on the sidewall of the lower channel 150 and have a ring shape with a first diameter (e.g., distance) R1 from a center of the lower channel 150, and a second portion 270b, which may contact the first portion 270a and protrude from the sidewall of the lower channel 150 in the horizontal direction, and have a ring shape with a second diameter R2 greater than the first diameter R1 from the center of the lower channel 150.

In example embodiments, a top surface of the second portion 270b of the gate insulation layer 270 may be lower than a top surface of the first portion 270a of the gate insulation layer 270, and a bottom surface of the second portion 270b of the gate insulation layer 270 may be higher than a bottom surface of the first portion 270a of the gate insulation layer 270.

In example embodiments, the first portion 270a of the gate insulation layer 270 may have a first thickness T1 in the horizontal direction gradually decreasing from a central portion toward a top portion or a bottom portion thereof, and the second portion 270b of the gate insulation layer 270 may have a second thickness T2 in the horizontal direction that may be substantially constant in the first direction.

In the oxidation process, an upper portion of the substrate 100 exposed by the opening 250 may be also oxidized to form a second insulation layer 275. The substrate 100 may include, for example, silicon, and thus the upper portion of the substrate 100 may be converted into a silicon oxide layer by the oxidation process, and may be merged with the first insulation layer pattern 115 on the top surface of the substrate 100 to have a greater volume.

However, not all portions of the first insulation layer pattern 115 on the top surface of the substrate 100 may be merged with the second insulation layer 275. In the oxidation process, water vapor and/or oxygen gas may not be sufficiently provided onto a portion of a top surface of the substrate 100 far from the opening 250, and thus no second insulation layer may be formed thereon. Accordingly, some portions of the insulation layer pattern 115 may remain (e.g., maintain an initial volume).

For example, referring to FIG. 1, an upper portion of the substrate 100 between the first opening 250a and the first and second channel columns 210a and 210b, or an upper portion of the substrate 100 between the second opening 250b and the third and fourth channel columns 210c and 210d may be oxidized to form the second insulation layer pattern 277, which may be merged with the first insulation layer pattern 115. However, an upper portion of the substrate 100 between the first channel column 210a and the third channel column 210c, or an upper portion of the substrate 100 between the second channel column 210b and the fourth channel column 210d may not be oxidized, and thus the insulation layer pattern 115 on the above upper portions of the substrate 100 may have its initial volume (i.e., its volume before the oxidation).

Hereinafter, the first insulation layer pattern 115 on the top surface of the substrate 100 together with the second insulation layer 275 merged therewith may be referred to as the second insulation layer 275.

In example embodiments, the second insulation layer 275 may include a first portion 275a extending in the third direction from the opening 250, a second portion 275b contacting the first portion 275a and extending in the first direction from the first portion 275a toward an inner portion of the substrate 100, and a third portion 275c contacting the second portion 275b and extending in the third direction from the second portion 275b.

A third thickness T3 of the first portion 275a of the second insulation layer 275 in the first direction may gradually decrease in the third direction when receding from the opening 250. That is, a height of a top surface of the first portion 275a of the second insulation layer 275 may be substantially constant in the third direction, and a height of a bottom surface of the first portion 275a of the second insulation layer 275 may gradually increase when receding from the opening 250.

In example embodiments, a fourth thickness T4 in the third direction of the second portion 275b of the second insulation layer 275 may be greater than a fifth thickness T5 in the first direction of the third portion 275c of the second insulation layer 275.

Figure 11:
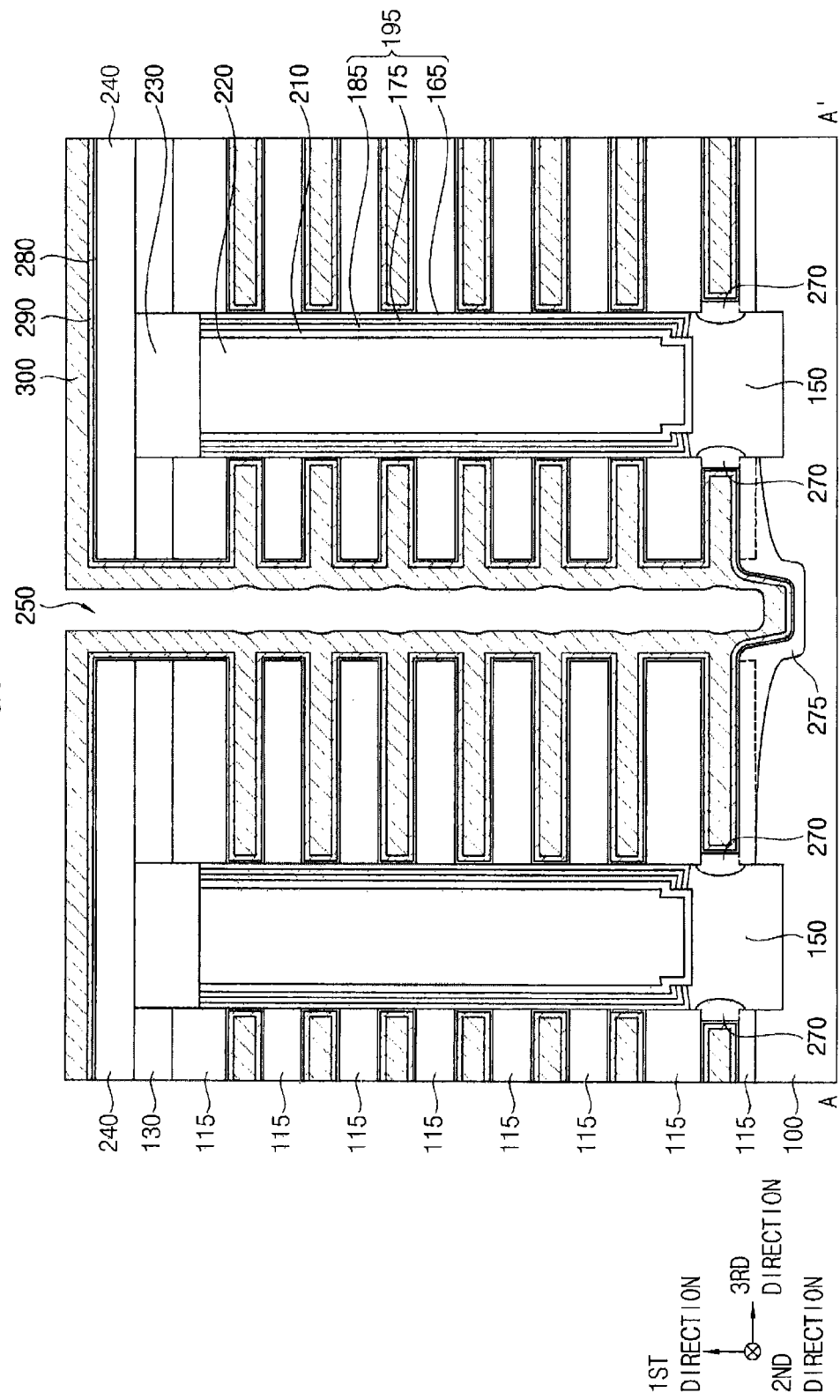

Referring to FIG. 11, a second blocking layer 280 and a gate barrier layer 290 may be sequentially formed on the exposed portion of the outer sidewall of the first blocking layer pattern 165, a sidewall of the gate insulation layer 270, an inner wall of the gap 260, a surface of the first insulation layer pattern 115, a top surface of the second insulation layer 275, and a top surface of the second insulating interlayer 240, and a gate conductive layer 300 may be formed on the gate barrier layer 290 to sufficiently fill a remaining portion of the gap 260.

In example embodiments, the second blocking layer 280 may be formed to include a metal oxide, for example, aluminum oxide, hafnium oxide, lanthanum oxide, lanthanum aluminum oxide, lanthanum hafnium oxide, hafnium aluminum oxide, titanium oxide, tantalum oxide, zirconium oxide, or the like. The gate conductive layer 300 may be formed to include a metal having a lower electrical resistance, for example, tungsten, titanium, tantalum, platinum, or the like. The gate barrier layer 290 may be formed to include a metal nitride, for example, titanium nitride, tantalum nitride, and the like. Alternatively, the gate barrier layer 290 may be formed to have a first layer including a metal and a second layer including a metal nitride.

Figure 12:
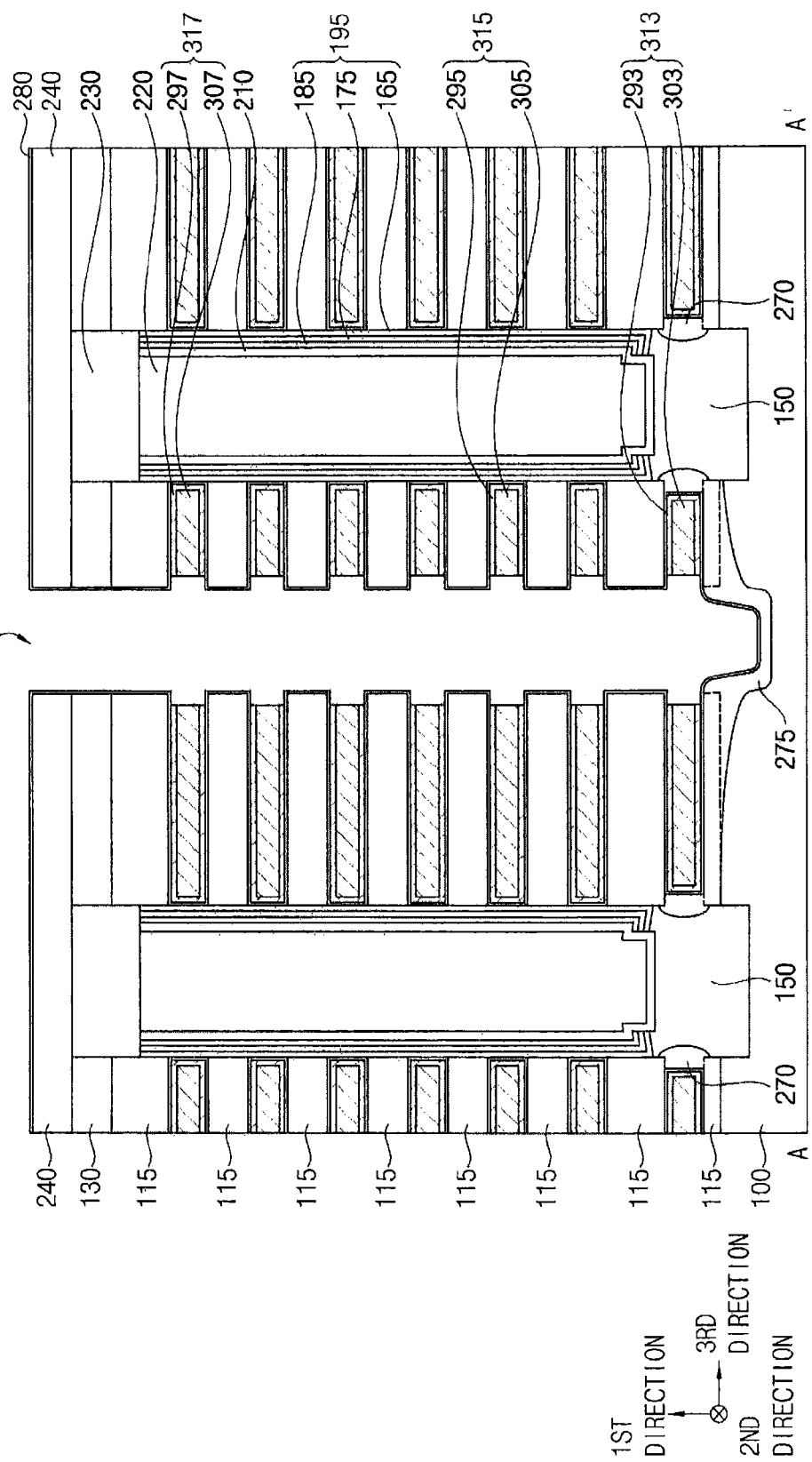

Referring to FIG. 12, the gate conductive layer 300 and the gate barrier layer 290 may be partially removed to form a gate conductive pattern and a gate barrier layer pattern, respectively, which may form a gate electrode. In example embodiments, the gate conductive layer 300 and the gate barrier layer 290 may be partially removed by, for example, a wet etch process, and thus the gate electrode may fill only a portion of the gap 260. Particularly, the gate electrode may fill the gap 260, except for an entrance thereof.

The gate electrode may extend in the second direction, and a plurality of gate electrodes may be formed in the third direction. The plurality of gate electrodes each extending in the second direction may be spaced apart from each other in the third direction by the opening 250.

In example embodiments, a plurality of gate electrodes may be formed at a plurality of levels spaced apart from each other in the first direction, and the plurality of gate electrodes may form a gate electrode structure. The gate electrode structure may include at least one first gate electrode 313, at least one second gate electrode 315, and at least one third gate electrode 317 sequentially stacked/formed over the top surface of the substrate 100 in the first direction.

The first gate electrode 313 may include a first gate conductive pattern 303 extending in the second direction, and a first gate barrier layer pattern 293 covering a top portion and a bottom portion of the first gate conductive pattern 303, and a sidewall of the first gate conductive pattern 303 facing a sidewall of the gate insulation layer 270. The second gate electrode 315 may include a second gate conductive pattern 305 extending in the second direction, and a second gate barrier layer pattern 295 covering a top portion and a bottom portion of the second gate conductive pattern 305, and a sidewall of the second gate conductive pattern 305 facing a sidewall of the charge storage layer structure 195. The third gate electrode 317 may include a third gate conductive pattern 307 extending in the second direction, and a third gate barrier layer pattern 297 covering a top portion and a bottom portion of the third gate conductive pattern 307, and a sidewall of the third gate conductive pattern 307 facing a sidewall of the charge storage layer structure 195.

In example embodiments, the first gate electrode 313 may serve as a GSL, the second gate electrode 315 may serve as a word line, and the third gate electrode 317 may serve as an SSL. In an example embodiment, the first gate electrode 313 may be formed at one level, the second gate electrode 315 may be formed at a plurality of levels, for example, even numbers of levels, and the third gate electrode 317 may be formed at two levels, however, present inventive concepts may not be limited thereto.

The first gate electrode 313 serving as the GSL may face the gate insulation layer 270 on the sidewall of the lower channel 150, and the second and third gate electrodes 315 and 317 serving as the word line and the SSL, respectively, may face sidewalls of the charge storage layer structure 195 on the outer sidewall of the upper channel 210.

Thus, the gate insulation layer 270, the second blocking layer 280, and the first gate electrode 313 may be sequentially stacked on the sidewall of the lower channel 150 in the horizontal direction, and the tunnel insulation layer pattern 185, the charge storage layer pattern 175, the first blocking layer pattern 165, the second blocking layer 280, and the second gate electrode 315 or the third gate electrode 317 may be sequentially stacked on the outer sidewall of the upper channel 210 in the horizontal direction.

Figure 13:
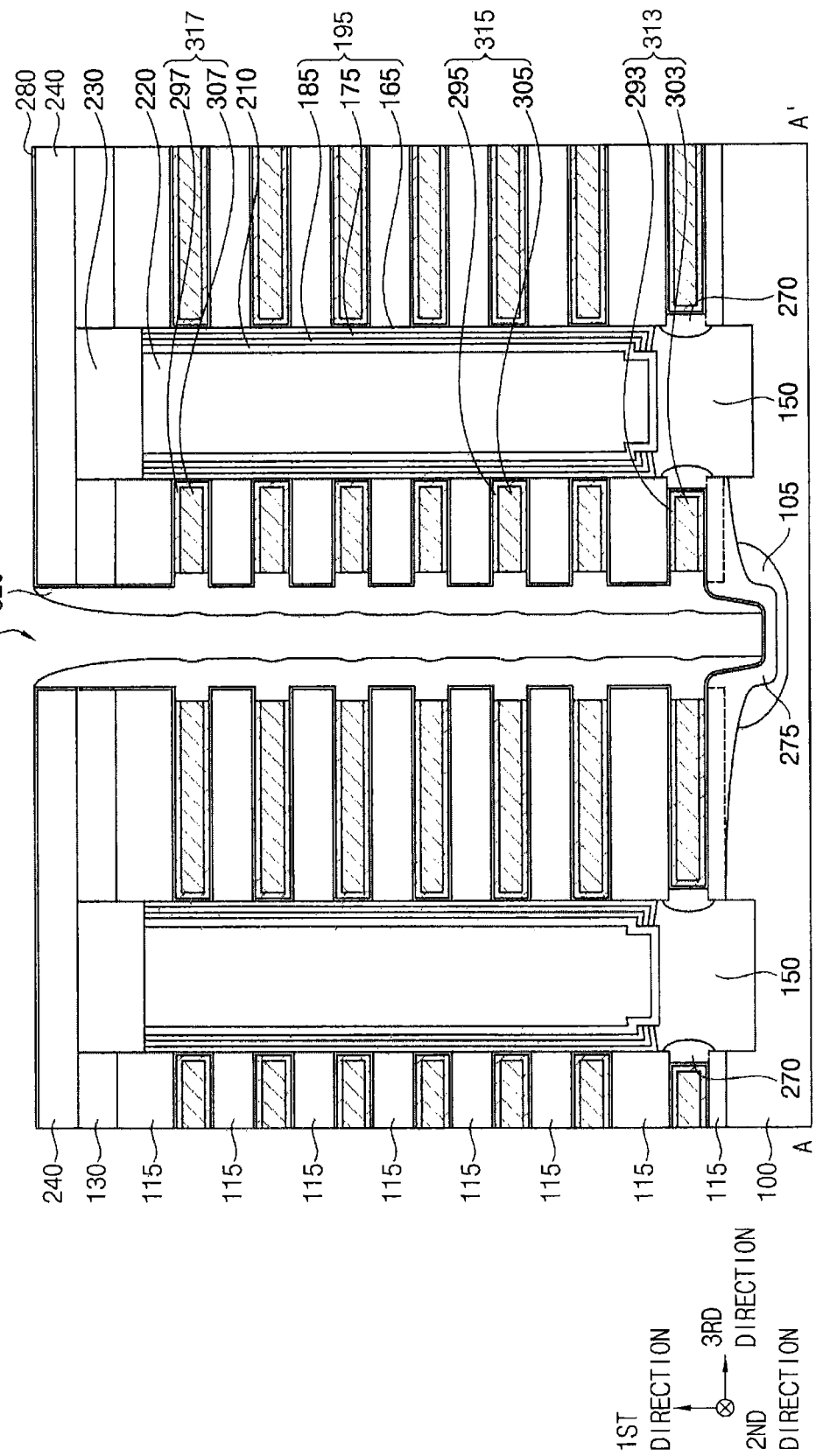

Referring to FIG. 13, impurities may be implanted into an upper portion of the substrate 100, via a portion of the second blocking layer 280 that may be exposed because the gate conductive layer 300 and the gate barrier layer 290 may be partially removed, and via a portion of the second insulation layer 275 thereunder, to form an impurity region 105. In example embodiments, the impurities may include n-type impurities, for example, phosphorus, arsenic, or the like.

After forming a second spacer layer on the second blocking layer 280, the second spacer layer may be anisotropically etched to form a second spacer 320 on a sidewall of the opening 250, and thus a portion of the second blocking layer 280 on the impurity region 105 may be exposed. The second spacer layer may be formed to include an oxide, for example, silicon oxide.

Alternatively, before forming the second spacer 320, impurities may be lightly implanted into an upper portion of the substrate 100/overlapped by the opening 250 to form a first impurity region, and after forming the second spacer 320, impurities may be heavily implanted into an upper portion of the substrate 100 using the second spacer 320 as an ion implantation mask to form a second impurity region.

As the gate electrodes 313, 315 and 317 may not be formed at the entrance of the gap 260, recesses/horizontal indentations may be formed on portions of a sidewall of the second spacer 320 facing the gate electrodes 313, 315 and 317, respectively.

Figure 14:
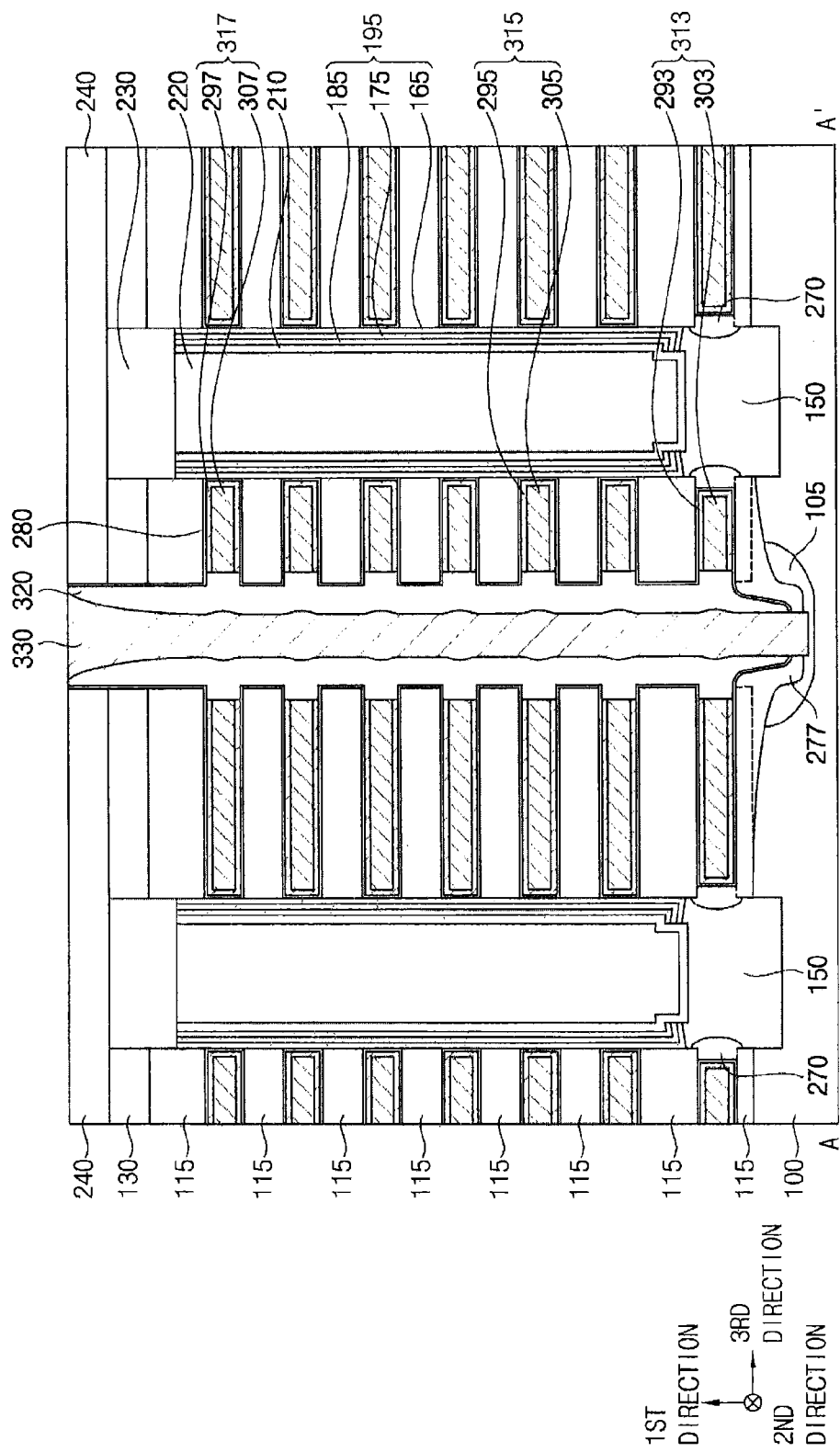

Referring to FIG. 14, portions of the second blocking layer 280 and the second insulation layer 275 may be etched using the second spacer 320 as an etching mask, and a portion of the second blocking layer 280 on the second insulation layer 240 may be also removed. Thus, the second insulation layer 275 may be divided into a plurality of second insulation layer patterns 277 spaced apart from each other in the third direction, and each second insulation layer pattern 277 may extend in the second direction. The impurity region 105 at an upper portion of the substrate 100 may be also partially removed.

A conductive layer may be formed on the impurity region 105, the second spacer 320 and the second insulating interlayer 240 to substantially fill a remaining portion of the opening 250, and may be planarized until a top surface of the second insulating interlayer 240 may be exposed to form a CSL 330. The conductive layer may be formed to include, for example, a metal, a metal nitride and/or a metal silicide.

In example embodiments, the CSL 330 may be formed to extend in the first direction, and further extend in the second direction. A lower portion of the CSL 330 may contact the second insulation layer pattern 277, and a bottom portion of the CSL 330 may be surrounded by the impurity region 105.

Referring to FIGS. 1, 2A and 2B again, a third insulating interlayer 340 may be formed on the second insulating interlayer 240, the CSL 330, the second spacer 320 and the second blocking layer 280, and a contact plug 350 may be formed through the second and third insulating interlayers 240 and 340 to contact a top surface of the capping layer pattern 230. A fourth insulating interlayer 360 may be formed on the third insulating interlayer 340 and the contact plug 350, and a bit line 370 may be formed through the fourth insulating interlayer 360 to contact a top surface of the contact plug 350.

The third and fourth insulting interlayers 340 and 360 may be formed to include an oxide, for example, silicon oxide, and the contact plug 350 and the bit line 370 may be formed to include a metal, for example, copper, aluminum, tungsten, titanium, tantalum, or the like, or a metal nitride, for example, titanium nitride, tantalum nitride, or the like.

In example embodiments, the bit line 370 may be formed to extend in the third direction, and a plurality of bit lines 370 may be formed in the second direction.

The vertical memory device may be completed by the above processes.

As illustrated above, the charge storage layer structure 195 may be formed between the upper channel 210 and the second gate electrode 315 and/or between the upper channel 210 and the third gate electrode 317, and thus a transistor including the word line or the SSL may have a sufficiently high breakdown voltage. However, no charge storage layer structure may be formed between the lower channel 150 and the first gate electrode 313, and thus a transistor including the GSL may not have a sufficiently high breakdown voltage. In example embodiments, the sidewall of the lower channel 150 may be oxidized to form the gate insulation layer 270 between the lower channel 150 and the first gate electrode 313, and thus the transistor including the GSL may also have a sufficiently high breakdown voltage.

Figure 15:
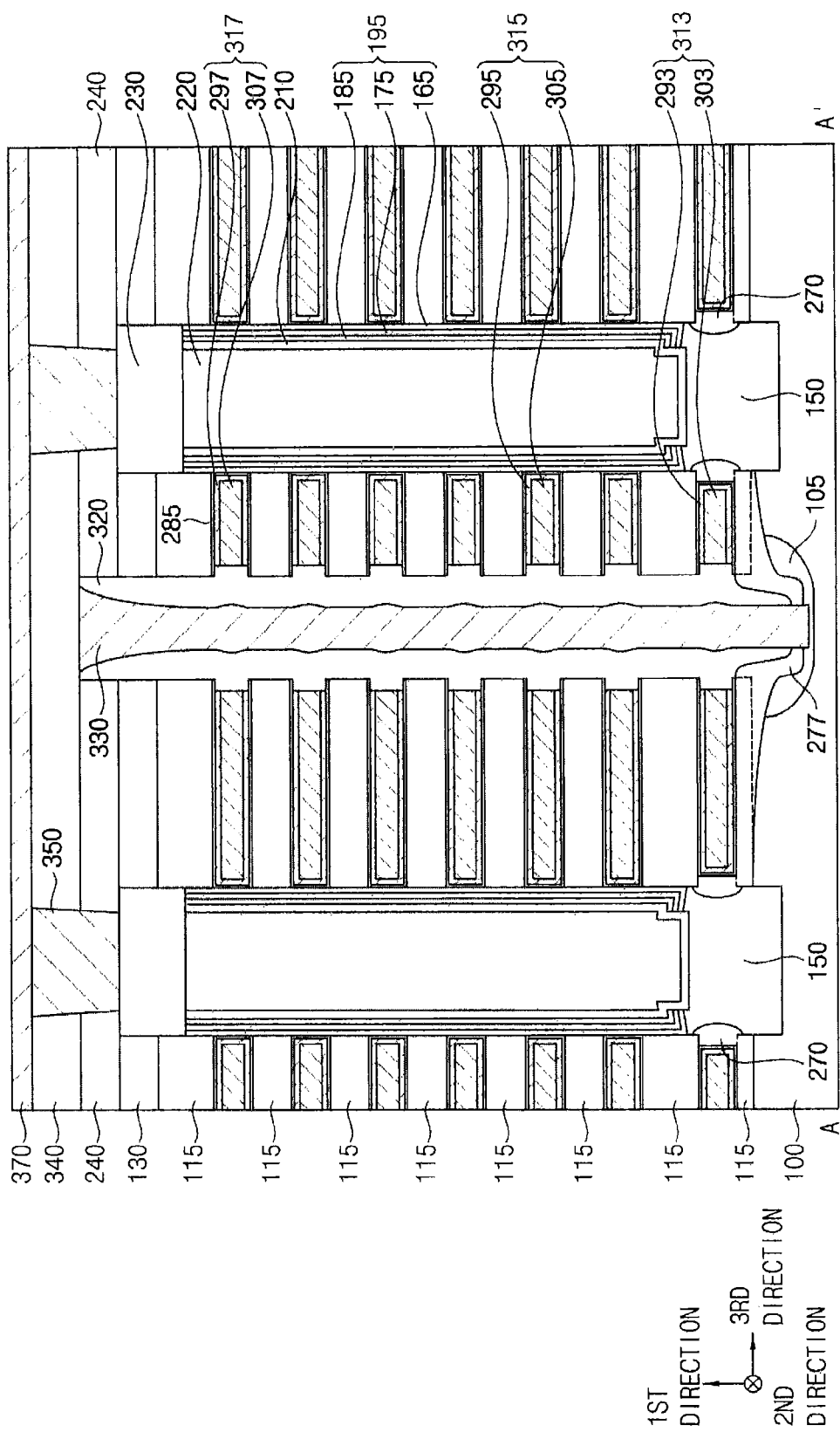

FIG. 15 is a cross-sectional view illustrating a vertical memory device in accordance with example embodiments. Particularly, FIG. 15 is a cross-sectional view taken along a line A-A' in FIG. 1. The vertical memory device may be substantially the same as or similar to that illustrated with reference to FIGS. 1, 2A and 2B, except for the shape of the second blocking layer. Thus, like reference numerals refer to like elements, and detailed descriptions thereon may be omitted below in the interest of brevity.

Referring to FIG. 15, the vertical memory device may include a first structure, a gate electrode structure, and a gate insulation layer 270 on a substrate 100. The vertical memory device may further include a capping layer pattern 230, a second blocking layer pattern 285, first and second insulation layer patterns 115 and 277, a second spacer 320, a CSL 330, first to fourth insulating interlayers 130, 240, 340, 360, a contact plug 350, and a bit line 370.

A top surface and a bottom surface, and a sidewall facing the gate insulation layer 270 or the charge storage layer structure 195 of each of the gate electrodes 313, 315 and 317 may be covered by the second blocking layer pattern 285. Thus, the gate insulation layer 270, the second blocking layer pattern 285, and the first gate electrode 313 may be sequentially stacked on a sidewall of the lower channel 150 in a horizontal direction, and the tunnel insulation layer pattern 185, the charge storage layer pattern 175, the first blocking layer pattern 165, the second blocking layer pattern 285, and the second gate electrode 315 or the third gate electrode 317 may be sequentially stacked on an outer sidewall of the upper channel 210 in the horizontal direction.

Unlike the second blocking layer 280 illustrated in FIGS. 1, 2A and 2B, the second blocking layer pattern 285 may not be formed on a sidewall of the first insulation layer pattern 115 not corresponding to a sidewall of the first structure or on a top surface of the second insulation layer pattern 277. Thus, a plurality of second blocking layer patterns 285 may be formed at a plurality of levels at which the gate electrodes 313, 315 and 317 may be formed to be spaced apart from each other in the first direction.

Figure 16:
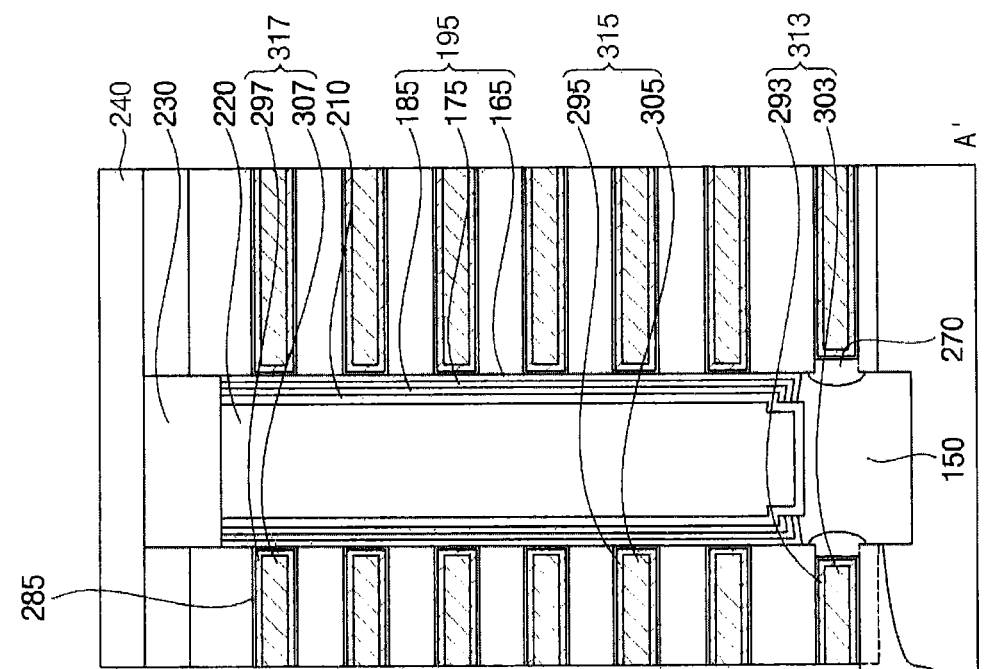
Figure 17:
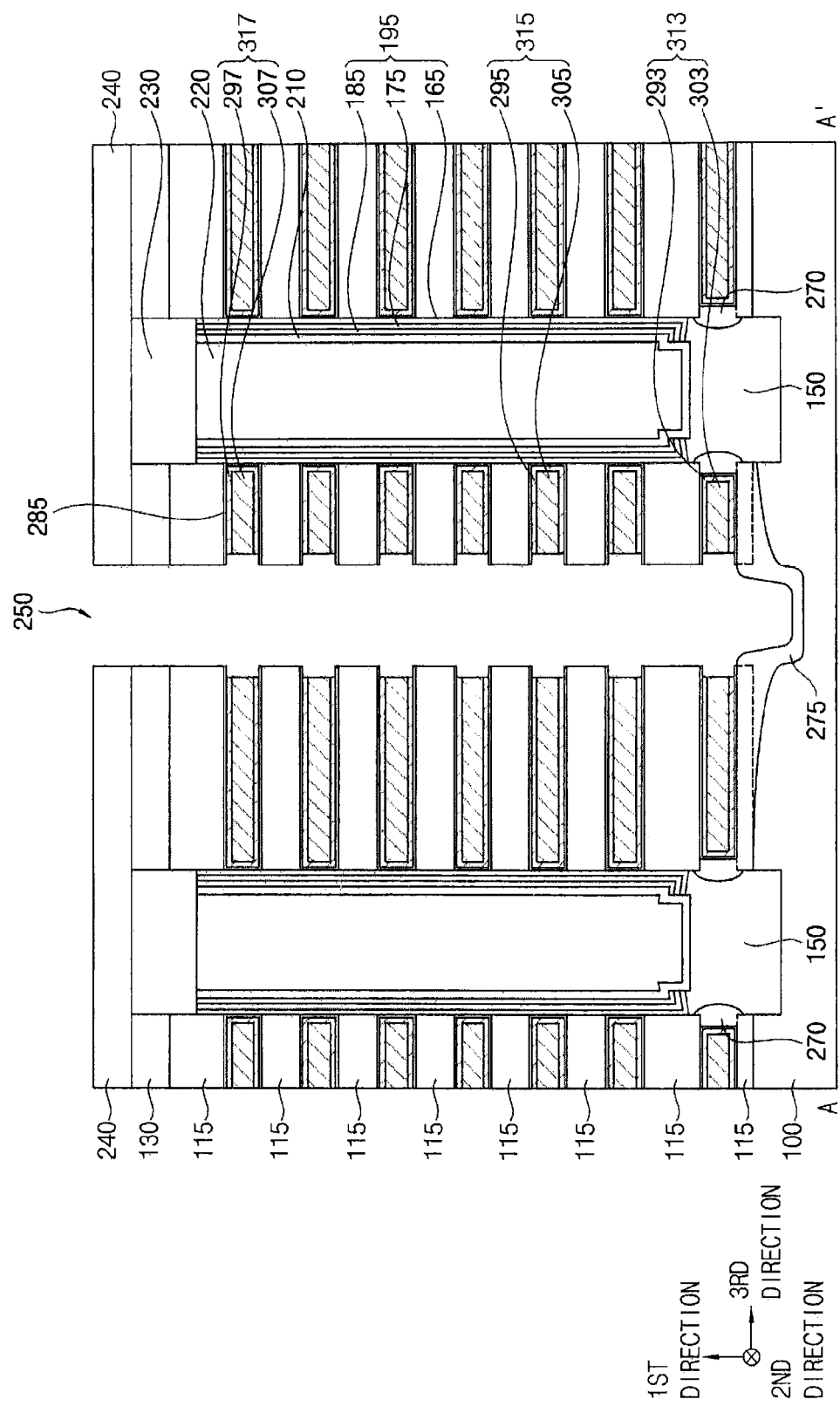
Figure 18:
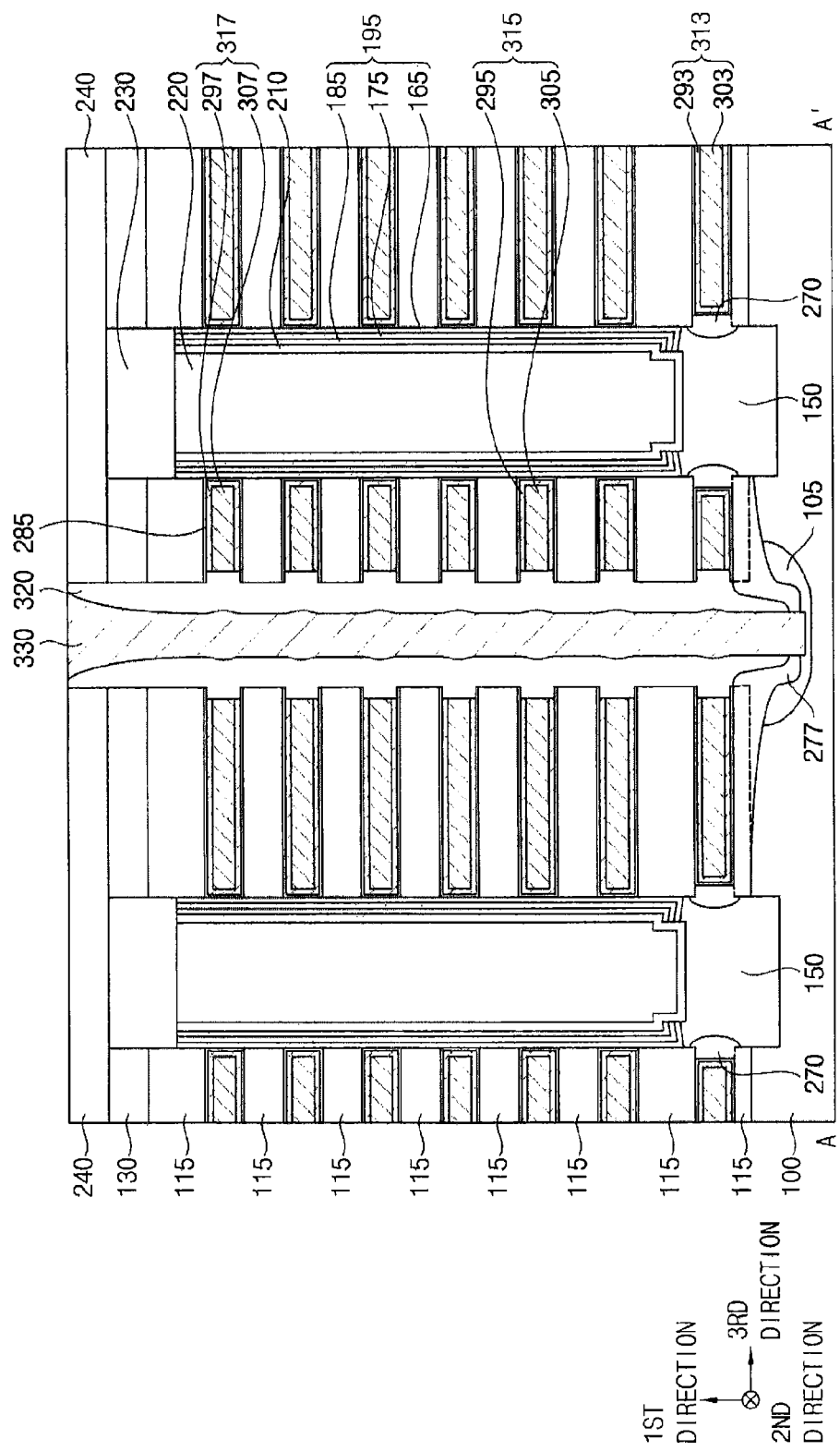

FIGS. 16 to 18 are cross-sectional views illustrating stages of a method of manufacturing a semiconductor device in accordance with example embodiments. FIGS. 16 to 18 are cross-sectional views taken along a line A-A' in FIG. 1. This method may include processes substantially the same as or similar to those illustrated with reference to FIGS. 3 to 14 and FIGS. 1, 2A and 2B. Thus, like reference numerals refer to like elements, and detailed descriptions thereon may be omitted below in the interest of brevity.

Processes substantially the same as or similar to those illustrated with reference to FIGS. 3 to 11 may be performed.

Referring to FIG. 16, a process substantially the same as or similar to that illustrated with reference to FIG. 12 may be performed. However, instead of the wet etch process, a dry etch process may be performed to partially remove the gate conductive layer 300 and the gate barrier layer 290, and thus portions of the second blocking layer 280 on a sidewall of the first insulation layer pattern 115 and a top surface of the second insulation layer 275 may be also removed.

By the dry etch process, a second blocking layer pattern 285 may be formed on an inner wall of the gap 260, and a sidewall of the charge storage layer structure 195 or the gate insulation layer 270, and gate electrodes 313, 315 and 317 each having a top portion, a bottom portion and a sidewall that may be covered by the second blocking layer pattern 285 may be formed. Each of the gate electrodes 313, 315 and 317 and the second blocking layer pattern 285 may fully fill each gap 260.

Referring to FIG. 17, a wet etch process may be performed to remove portions of the gate electrodes 313, 315 and 317 at entrances of the gaps 260.

By the dry etch process illustrated with reference to FIG. 16, the gate electrodes 313, 315 and 317 at a plurality of levels may not be divided from each other, and thus the wet etch process may be performed to sufficiently divide the gate electrodes 313, 315 and 317 from each other. Thus, each of the gate electrodes 313, 315 and 317 may be formed to fill each gap 260 except for the entrance thereof.

Referring to FIG. 18, processes substantially the same as or similar to those illustrated with reference to FIGS. 13 and 14 may be performed to form a CSL 330 and a second spacer 320.

Referring to the structure in FIG. 15 again, a process substantially the same as or similar to that for the structure illustrated with reference to FIGS. 1, 2A and 2B may be performed to complete the vertical memory device.

Figure 19:
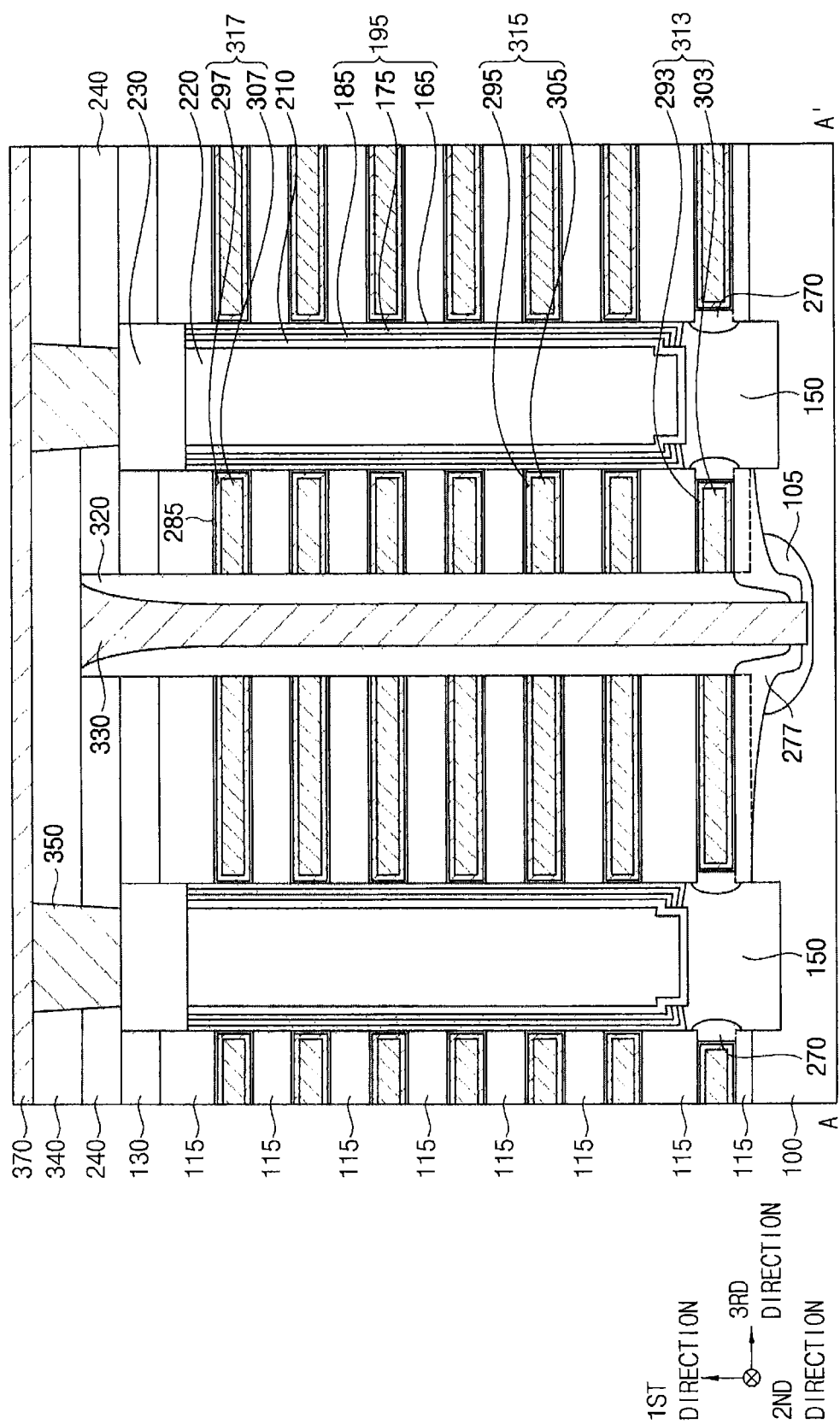

FIG. 19 is a cross-sectional view illustrating a vertical memory device in accordance with example embodiments. Particularly, FIG. 19 is a cross-sectional view taken along a line A-A' in FIG. 1. The vertical memory device may be substantially the same as or similar to that illustrated with reference to FIG. 15, except for the shapes of gate electrode, the second spacer and the CSL. Thus, like reference numerals refer to like elements, and detailed descriptions thereon may be omitted below in the interest of brevity.

Referring to FIG. 19, the vertical memory device may include a first structure, a gate electrode structure, and a gate insulation layer 270 on a substrate 100. The vertical memory device may further include a capping layer pattern 230, a second blocking layer pattern 285, first and second insulation layer patterns 115 and 277, a second spacer 320, a CSL 330, first to fourth insulating interlayers 130, 240, 340, 360, a contact plug 350, and a bit line 370.

Unlike the gate electrodes 313, 315 and 317 illustrated in FIG. 15, a length in the third direction of each of the gate electrodes 313, 315 and 317 may be substantially the same as that of the first insulation layer pattern 115 in the third direction, which may be formed between the gate electrodes 313, 315 and 317 in the first direction. That is, each of the gate electrodes 313, 315 and 317 may fully fill the gap 260 (refer to FIG. 10A).

Thus, the CSL 330 may have no protrusions at portions thereof adjacent to the gate electrodes 313, 315 and 317, and correspondingly, the second spacer 320 may have no recesses/horizontal indentations.

The vertical memory device shown in FIG. 19 may be manufactured by not performing the wet etch process illustrated with reference to FIG. 17, after performing the dry etch process illustrated with reference to FIG. 16. That is, when the gate electrodes 313, 315 and 317 may be sufficiently divided from each other by the dry etch process, an additional wet etch process may not be performed. Thus, subsequent processes may be performed with no wet etch process to complete the vertical memory device.

Figure 20:
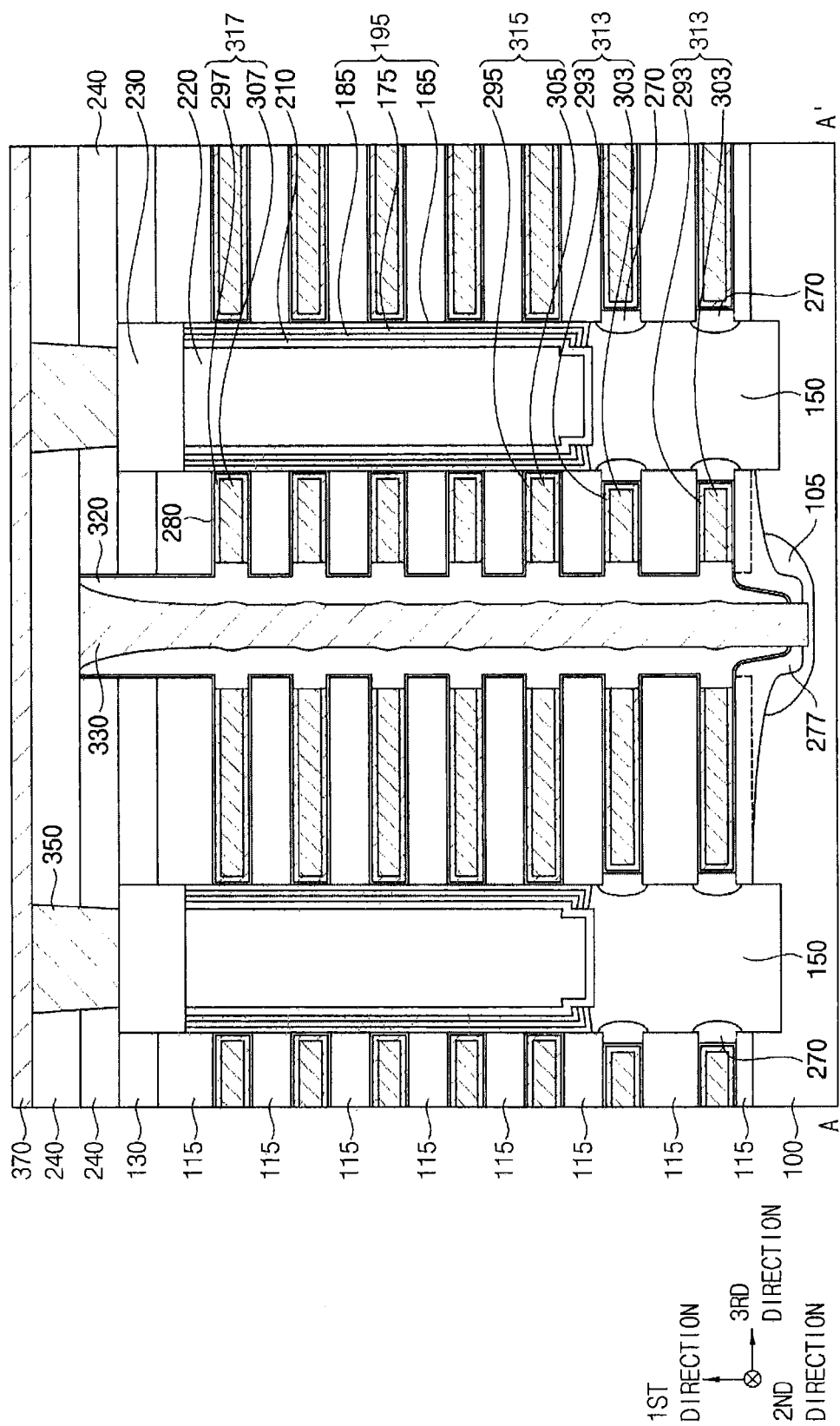

FIG. 20 is a cross-sectional view illustrating a vertical memory device in accordance with example embodiments. Particularly, FIG. 20 is a cross-sectional view taken along a line A-A' in FIG. 1. The vertical memory device may be substantially the same as or similar to that illustrated with reference to FIGS. 1, 2A and 2B, except for the number of the first gate electrode and the shape of the lower channel. Thus, like reference numerals refer to like elements, and detailed descriptions thereon may be omitted below in the interest of brevity.

Referring to FIG. 20, the vertical memory device may include a first structure, a gate electrode structure, and a gate insulation layer 270 on a substrate 100. The vertical memory device may further include a capping layer pattern 230, a second blocking layer 280, first and second insulation layer patterns 115 and 277, a second spacer 320, a CSL 330, first to fourth insulating interlayers 130, 240, 340, 360, a contact plug 350, and a bit line 370.

Unlike the first gate electrode 313 illustrated in FIGS. 1, 2A and 2B, the first gate electrode 313 may be formed not only at a first level but also at a second level over a top surface of the substrate 100 among the plurality of levels at which the gate electrodes 313, 315 and 317 may be formed. Thus, the vertical memory device may include two GSLs at two levels, respectively.

The gate insulation layers 270 may be formed on portions of a sidewall of the lower channel 150 facing the first gate electrodes 313, and the second insulation layer pattern 277 may be formed between the top surface of the substrate 100 and a lower one of the first gate electrodes 313 at the first level.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of forming a semiconductor device, the method comprising:
    forming a channel recess in a stack of alternating first insulation layers and sacrificial layers;
    forming a first channel material in the channel recess;
    forming a charge storage structure on the first channel material, in the channel recess;
    forming a second channel material on opposing sidewalls of the charge storage structure, in the channel recess;
    removing the sacrificial layers from the stack to expose a sidewall of the first channel material;
    oxidizing, via an oxide growth process, the sidewall of the first channel material to form a gate insulation layer, wherein the oxide growth process further comprises growing a second insulation layer on a surface of a substrate to form a sloped interface of the second insulation layer with the substrate; and
    forming a gate electrode in a recess adjacent a sidewall of the gate insulation layer, wherein the gate insulation layer is between the first channel material and the gate electrode.

2. The method of claim 1, wherein oxidizing the sidewall of the first channel material comprises growing the gate insulation layer to protrude into a portion of the recess.

3. The method of claim 2, wherein the portion of the recess into which the gate insulation layer protrudes comprises a first portion of the recess, and wherein forming the gate electrode comprises forming the gate electrode in a second portion of the recess that is free of the gate insulation layer.

4. The method of claim 3, wherein forming the gate electrode comprises depositing tungsten adjacent the sidewall of the gate insulation layer, in the second portion of the recess that is free of the gate insulation layer.

5. The method of claim 4, wherein depositing the tungsten comprises depositing the tungsten on the sidewall of the gate insulation layer, in the second portion of the recess that is free of the gate insulation layer, such that the gate electrode and the gate insulation layer are laterally adjacent and vertically non-overlapping.

6. The method of claim 1, wherein oxidizing the sidewall of the first channel material comprises converting a portion of the first channel material into an oxide layer while blocking the second channel material from oxidation.

7. The method of claim 1, further comprising forming a blocking layer pattern in recesses between the first insulation layers, after removing the sacrificial layers.

8. The method of claim 7, wherein the blocking layer pattern is confined to the recesses.

9. The method of claim 1, wherein forming the gate electrode comprises forming a gate selection line in the recess adjacent the sidewall of the gate insulation layer, wherein the gate insulation layer is between the first channel material and the gate selection line.

10. The method of claim 9, wherein:
the recess comprises a first recess;
the gate selection line comprises a first gate selection line; and
forming the gate selection line comprises forming the first gate selection line in the first recess and forming a second gate selection line in a second recess that overlaps the first recess.

11. The method of claim 1, wherein the first and second channel materials comprise a same semiconductor material.

12. The method of claim 1, wherein forming the first channel material comprises performing a Selective Epitaxial Growth (SEG) process to form the first channel material in the channel recess, and wherein oxidizing comprises performing the oxide growth process on the sidewall of the first channel material formed by the SEG process to form the gate insulation layer.

13. The method of claim 1, further comprising forming an opening in the stack after forming the second channel material, wherein removing the sacrificial layers comprises removing the sacrificial layers after forming the opening, and wherein oxidizing via the oxide growth process comprises performing a wet oxidation process via the opening.

14. The method of claim 13, wherein performing the wet oxidation process comprises forming the gate insulation layer by performing an In Situ Steam Generation (ISSG) process via the opening.

15. The method of claim 13, wherein:
the method further comprises forming the stack on the substrate; and
forming the opening in the stack comprises exposing the surface of the substrate before growing the second insulation layer.

16. A method of forming a semiconductor device, the method comprising:
forming a plurality of channel recesses in a stack of alternating first insulation layers and sacrificial layers;
forming a first semiconductor channel material in the plurality of channel recesses;
forming charge storage structures in respective ones of the plurality of channel recesses, on the first semiconductor channel material;
forming a second semiconductor channel material on sidewalls of the charge storage structures, in the plurality of channel recesses;
removing the sacrificial layers from the stack to form recesses that expose sidewalls of the first semiconductor channel material;
performing a wet oxidation process on the sidewalls of the first semiconductor channel material to form a gate insulation layer, wherein the wet oxidation process further comprises growing a second insulation layer on a surface of a substrate to form a sloped interface of the second insulation layer with the substrate, and wherein a thickness of a portion of the second insulation layer gradually decreases toward the first semiconductor channel material; and
forming gate electrodes in respective ones of the recesses, wherein the gate insulation layer is between the first semiconductor channel material and the gate electrodes.

17. A method of forming a semiconductor device, the method comprising:
forming a stack of alternating first insulation layers and sacrificial layers on a substrate;
forming a channel recess in the stack to expose a first portion of the substrate;
forming a first channel material on the first portion of the substrate, in the channel recess;
forming a charge storage structure on the first channel material, in the channel recess;
forming a second channel material on opposing sidewalls of the charge storage structure, in the channel recess;
forming an opening in the stack to expose a second portion of the substrate;
removing the sacrificial layers from the stack to expose a sidewall of the first channel material, after forming the opening the stack;
performing a wet oxidation process on the sidewall of the first channel material to form a gate insulation layer, and on the second portion of the substrate to form a second insulation layer, wherein an interface of the second insulation layer with the substrate is curved; and
forming a gate electrode in a recess adjacent a sidewall of the gate insulation layer, wherein the gate insulation layer is between the first channel material and the gate electrode.

18. The method of claim 17, wherein, after performing the wet oxidation process, a height of an upper surface of the substrate between the channel recess and the opening gradually decreases from the channel recess toward the opening.

19. The method of claim 15, wherein, after the oxide growth process, a thickness of a portion of the second insulation layer between the channel recess and the opening gradually increases from the channel recess toward the opening.

20. The method of claim 16, wherein the sloped interface extends to the first semiconductor channel material.

* * * * *